United States Patent
Ranjan et al.

(10) Patent No.: US 9,349,941 B2
(45) Date of Patent: May 24, 2016

(54) STTMRAM ELEMENT HAVING MULTIPLE PERPENDICULAR MTJS COUPLED IN SERIES

(71) Applicant: Avalanche Technology, Inc., Fremont, CA (US)

(72) Inventors: Rajiv Yadav Ranjan, San Jose, CA (US); Parviz Keshtbod, Los Altos Hills, CA (US); Roger Klas Malmhall, San Jose, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 14/944,117

(22) Filed: Nov. 17, 2015

(65) Prior Publication Data

US 2016/0079517 A1    Mar. 17, 2016

Related U.S. Application Data

(63) Continuation of application No. 13/893,303, filed on May 13, 2013, now Pat. No. 9,218,866, which is a continuation of application No. 11/866,830, filed on Oct. 3, 2007, now abandoned, which is a (Continued)

(51) Int. Cl.
   *G11C 11/00*   (2006.01)
   *H01L 43/02*   (2006.01)
   (Continued)

(52) U.S. Cl.
   CPC .............. *H01L 43/02* (2013.01); *G11C 11/161* (2013.01); *G11C 11/1673* (2013.01); *G11C 11/1675* (2013.01); *G11C 11/5607* (2013.01);
   *H01L 27/222* (2013.01); *H01L 43/08* (2013.01); *H01L 43/10* (2013.01)

(58) Field of Classification Search
   CPC ........................................................ G11C 11/00
   USPC ......... 365/48, 55, 62, 66, 74, 78, 80–93, 100, 365/130, 131, 148, 158, 171–173, 209, 213, 365/225.5, 230.07, 232, 243.5; 257/421, 257/E21.665; 438/3; 977/933–935
   See application file for complete search history.

(56) References Cited

U.S. PATENT DOCUMENTS 6,937,497 B1 *  8/2005  Ju et al. .......................... 365/130
7,345,852 B2 *  3/2008  Inomata et al. ................ 360/314
(Continued)

OTHER PUBLICATIONS

Search report from State Intellectual Property Office of People's Republic of China for China Application 201310054306.0.
(Continued)

*Primary Examiner* — Harry W Byrne
(74) *Attorney, Agent, or Firm* — Maryam Imam; Bing K. Yen

(57) ABSTRACT

The present invention is directed to a multi-state current-switching magnetic memory element configured to store a state by current flowing therethrough to switch the state. The magnetic memory element includes a stack of two or more magnetic tunneling junctions (MTJs) with each MTJ including a free layer with a switchable magnetic orientation perpendicular to a layer plane thereof, a barrier layer, and a fixed layer with a fixed magnetic orientation perpendicular to a layer plane thereof. Each MTJ is separated from other MTJs in the stack by at least an isolation layer. The stack of MTJs may store more than one bit of information. The free layer of each MTJ has a switching current threshold different from free layers of other MTJs in the stack.

9 Claims, 15 Drawing Sheets

Related U.S. Application Data continuation-in-part of application No. 11/678,515, filed on Feb. 23, 2007, now Pat. No. 8,058,696, which is a continuation-in-part of application No. 11/674,124, filed on Feb. 12, 2007, now Pat. No. 8,084,835, said application No. 11/866,830 is a continuation-in-part of application No. 11/860,467, filed on Sep. 24, 2007, now Pat. No. 8,018,011, which is a continuation-in-part of application No. 11/678,515, filed on Feb. 23, 2007, now Pat. No. 8,058,696.

(51) Int. Cl.
*G11C 11/56* (2006.01)
*H01L 27/22* (2006.01)
*G11C 11/16* (2006.01)
*H01L 43/08* (2006.01)
*H01L 43/10* (2006.01)

(56) References Cited

U.S. PATENT DOCUMENTS

| | | | |
|---|---|---|---|
| 2002/0036331 A1* | 3/2002 | Nickel et al. | 257/421 |
| 2005/0045929 A1* | 3/2005 | Janesky et al. | 257/295 |
| 2005/0047198 A1* | 3/2005 | Engel et al. | 365/158 |

OTHER PUBLICATIONS

Search report from State Intellectual Property Office of People's Republic China for China Application 201310054374.7.
Search report from State Intellectual Property Office of People's Republic China for China Application 201310054848.8.

* cited by examiner

MLC cell with two or more stacked MTJ with different anisotrophy.

| I density | 100 | n= 2 | | Parallel | Anti-parallel |
|---|---|---|---|---|---|
| Anisotrophy ratio | | 2 | R(KΩ) large | 1 | 2 |
| | Large | Small | R(KΩ) small | 2 | 4 |

| Fixed layers | Free layer 1 | Free layer 2 | State | Total R | Prog I (uA) |
|---|---|---|---|---|---|
| → | → | → | 1 | 3 | 200 |
| → | → | ← | 2 | 5 | -50 |
| → | ← | ← | 3 | 6 | -200 |
| → | ← | → | 4 | 4 | 50 |

Table 1

FIG. 13(a)

MLC cell with two or more MTJs side by side with different anisotrophy.

| I density | 50 | n= 2 | | Parallel | Anti-parallel |
|---|---|---|---|---|---|
| Anisotrophy ratio | | 1.3 | R(KΩ) large | 3 | 6 |
| | Small | Large | R(KΩ) small | 3.9 | 7.8 |

| Fixed laye | Free layer | Free layer | State | Total R | Prog I (uA) |
|---|---|---|---|---|---|
| → | → | → | 1 | 1.70 | -134.5 |
| → | → | ← | 2 | 2.36 | 50 |
| → | ← | ← | 3 | 3.39 | 134.5 |
| → | ← | → | 4 | 2.17 | -50 |

| From one state to another | 1 to 2 | 2 to 3 | 3 to 4 |
|---|---|---|---|
| R differences | 0.67 | 1.03 | 1.22 | 0.47 |
| between different states | | | | |

Table 2

FIG. 13(b)

|  |  | I<br>I = 600 µA | II<br>I = 200 µA | III<br>I = -600 µA | IV<br>I = -200 µA |
|---|---|---|---|---|---|
| MTJ1 | Free | → | ← | ← | → |
|  | Fixed | → | → | → | → |
| MTJ2 | Free | → | → | ← | ← |
|  | Fixed | → | → | → | → |
|  |  |  |  |  |  |
| State |  | 0 0 | 0 1 | 1 1 | 1 0 |

Table 3

FIG. 13(c)

|  | MgO Tunnel | MTJ1 | | MTJ2 | |
|---|---|---|---|---|---|
|  |  | R1 (Ω) | R2 (Ω) | R3 (Ω) | R4 (Ω) |
| Scenario 1 | 1.0 : 1.2 | 400 | 800 | 600 | 1320 |
| Scenario 2 | 1.2 : 1.5 | 600 | 1320 | 800 | 2000 |
| Scenario 3 | 1.0 : 2.0 | 400 | 800 | 2000 | 6000 |
| State |  | 0 | 1 | 0 | 1 |

Table 4

FIG. 13(d)

Total Stack Resistance by State (in Ω)

|  | 0 0 | 0 1 | 1 0 | 1 1 |
|---|---|---|---|---|
| Scenario 1 | 1000 | 1400 | 1720 | 2120 |
| Scenario 2 | 1400 | 2120 | 2600 | 3320 |
| Scenario 3 | 2400 | 2800 | 6400 | 6800 |

Table 5

FIG. 13(e)

STTMRAM ELEMENT HAVING MULTIPLE PERPENDICULAR MTJS COUPLED IN SERIES

CROSS REFERENCE TO RELATED APPLICATIONS

This application is a continuation application of U.S. patent application Ser. No. 13/893,303, filed on May 13, 2013, by Rajiv Yadav Ranjan, et al., and entitled "AN IMPROVED HIGH CAPACITY LOW COST MULTI-STATE MAGNETIC MEMORY", which is a continuation of U.S. patent application Ser. No. 11/866,830, filed on Oct. 3, 2007, by Rajiv Yadav Ranjan, et al., and entitled "IMPROVED HIGH CAPACITY LOW COST MULTI-STATE MAGNETIC MEMORY", which is a continuation-in-part of U.S. patent application Ser. No. 11/678,515, entitled "A High Capacity Low Cost Multi-State Magnetic Memory," filed Feb. 23, 2007, which was a continuation-in-part of U.S. patent application Ser. No. 11/674,124, entitled "Non-Uniform Switching Based on Non-Volatile Magnetic Base Memory," filed Feb. 12, 2007, and is a continuation-in-part of U.S. patent application Ser. No. 11/860,467, entitled, "A Low Cost Multi-State Magnetic Memory", filed Sep. 24, 2007, which is a continuation-in-part of U.S. patent application Ser. No. 11/678,515, entitled "A High Capacity Low Cost Multi-State Magnetic Memory," filed Feb. 23, 2007, the disclosures of which are incorporated herein by reference, as though set forth in full.

BACKGROUND OF THE INVENTION

Field of the Invention

The present invention relates generally to non-volatile magnetic memory and particularly to multi-state magnetic memory.

Description of the Prior Art

Computers conventionally use rotating magnetic media, such as hard disk drives (HDDs), for data storage. Though widely used and commonly accepted, such media suffer from a variety of deficiencies, such as access latency, higher power dissipation, large physical size and inability to withstand any physical shock. Thus, there is a need for a new type of storage device devoid of such drawbacks.

Other dominant storage devices are dynamic random access memory (DRAM) and static RAM (SRAM), which are very costly but have fast random read/write access time. Solid state storage, such as solid-state-nonvolatile-memory (SS-NVM) devices having memory structures made of NOR/NAND-based Flash memory, provides fast access time, increased input/output (IOP) speed, decreased power dissipation and physical size and increased reliability but at a higher cost which tends to be generally multiple times higher than hard disk drives (HDDs).

Although NAND-based Flash memory is more costly than HDDs, it has replaced magnetic hard drives in many applications such as digital cameras, MP3-players, cell phones, and hand held multimedia devices due, at least in part, to its characteristic of being able to retain data even when power is disconnected. However, as memory dimension requirements are dictating decreased sizes, scalability is becoming an issue because the designs of NAND-based Flash memory and DRAM memory are becoming difficult to scale with smaller dimensions. For example, NAND-based Flash memory has issues related to capacitive coupling, few electrons/bit, poor error-rate performance and reduced reliability due to decreased read-write endurance. Read-write endurance refers to the number of reading, writing and erase cycles before the memory starts to degrade in performance due primarily to the high voltages required in the program, erase cycles.

It is believed that NAND Flash, especially multi-bit designs thereof, would be extremely difficult to scale below 45 nanometers. Likewise, DRAM has issues related to scaling of the trench capacitors leading to very complex designs that are becoming increasingly difficult to manufacture, leading to higher cost.

Currently, applications commonly employ combinations of EEPROM/NOR, NAND, HDD, and DRAM as a part of the memory in a system design. Designs of different memory technologies in a product add to design complexity, time to market and increased costs. For example, in hand-held multi-media applications incorporating various memory technologies, such as NAND Flash, DRAM and EEPROM/NOR Flash memory, complexity of design is increased as are manufacturing costs and time to market. Another disadvantage is the increase in size of a device that incorporates all of these types of memories therein.

There has been an extensive effort in development of alternative technologies such as Ovanic RAM (or phase-change memory), Ferromagnetic RAM (FeRAM), Magnetic RAM (MRAM), probe-based storage such as Millipede from International Business Machines, Inc. of San Jose, Calif., or Nano-chip, and others to replace memories used in current designs such as DRAM, SRAM, EEPROM/NOR Flash, NAND Flash and HDD in one form or another. Although these various memory/storage technologies have created many challenges, there have been advances made in this field in recent years. MRAM seems to lead the way in terms of its progress in the past few years to replace all types of memories in the system as a universal memory solution.

One of the problems with prior art memory structures is that the current and power requirements are too high to make a functional memory device or cell. This also poses a key concern regarding the reliability of such devices due to likely dielectric breakdown of the tunneling barrier layer and thereby making it non-functional.

The challenge with other prior art techniques has been that the switching current is too high to allow the making of a functional device for memory applications due to the memory's high power consumption. Several recent publications, such as those cited below as references 5 and 6 (5'6), have shown that the switching current can be reduced by having the memory element pinned by two anti-ferromagnetic (AF) coupled layers resulting in spin oscillations or "pumping" and thereby reducing the switching current.

An additionally known problem is using magnetic memory to store more than two states therein. To this end, multi-level or multi-state magnetic memory cells or elements for storing more than one bit of information do not exist.

What is needed is magnetic memory for storing more than one bit of digital information.

SUMMARY OF THE INVENTION

To overcome the limitations in the prior art described above, and to overcome other limitations that will become apparent upon reading and understanding the present specification, the present invention discloses a method and a corresponding structure for a magnetic storage memory device that is based on current-induced magnetization-switching having reduced switching current in the magnetic memory.

Briefly, an embodiment of the present invention includes multi-state current-switching magnetic memory element including a stack of two or more magnetic tunneling junctions (MTJs), each MTJ having a free layer and being separated from other MTJs in the stack by a seeding layer formed upon an isolation layer, the stack for storing more than one bit of information, wherein different levels of current applied to the memory element cause switching to different states.

These and other objects and advantages of the present invention will no doubt become apparent to those skilled in the art after having read the following detailed description of the preferred embodiments illustrated in the several figures of the drawings.

IN THE DRAWINGS

Figure 3:
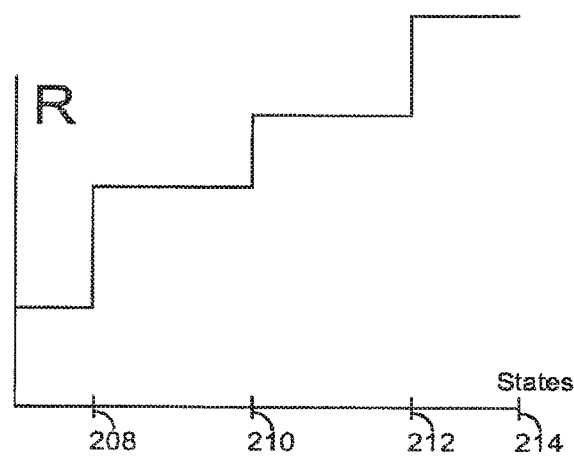

FIG. 3 shows a graph of the level of resistance (R) of each of the layers 118, 114, 110 and 106 (shown in the y-axis) vs. the state of the memory element 100.

Figure 4:
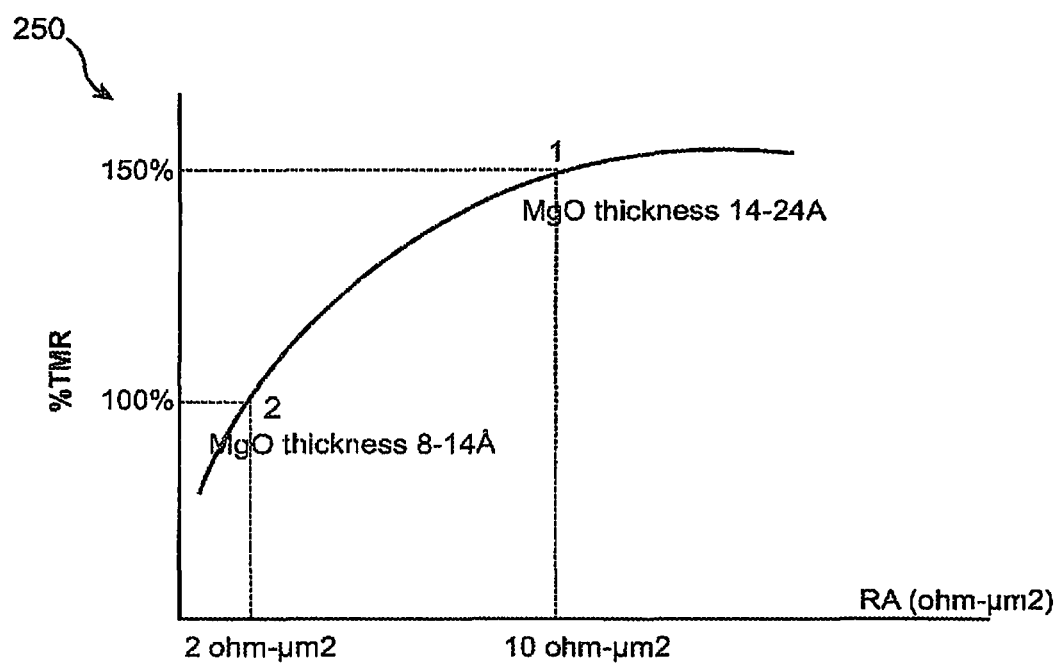

FIG. 4 shows a graph 250 of the tunneling magneto resistance (TMR), shown in the y-axis, vs. the resistance area (RA).

Figure 5:
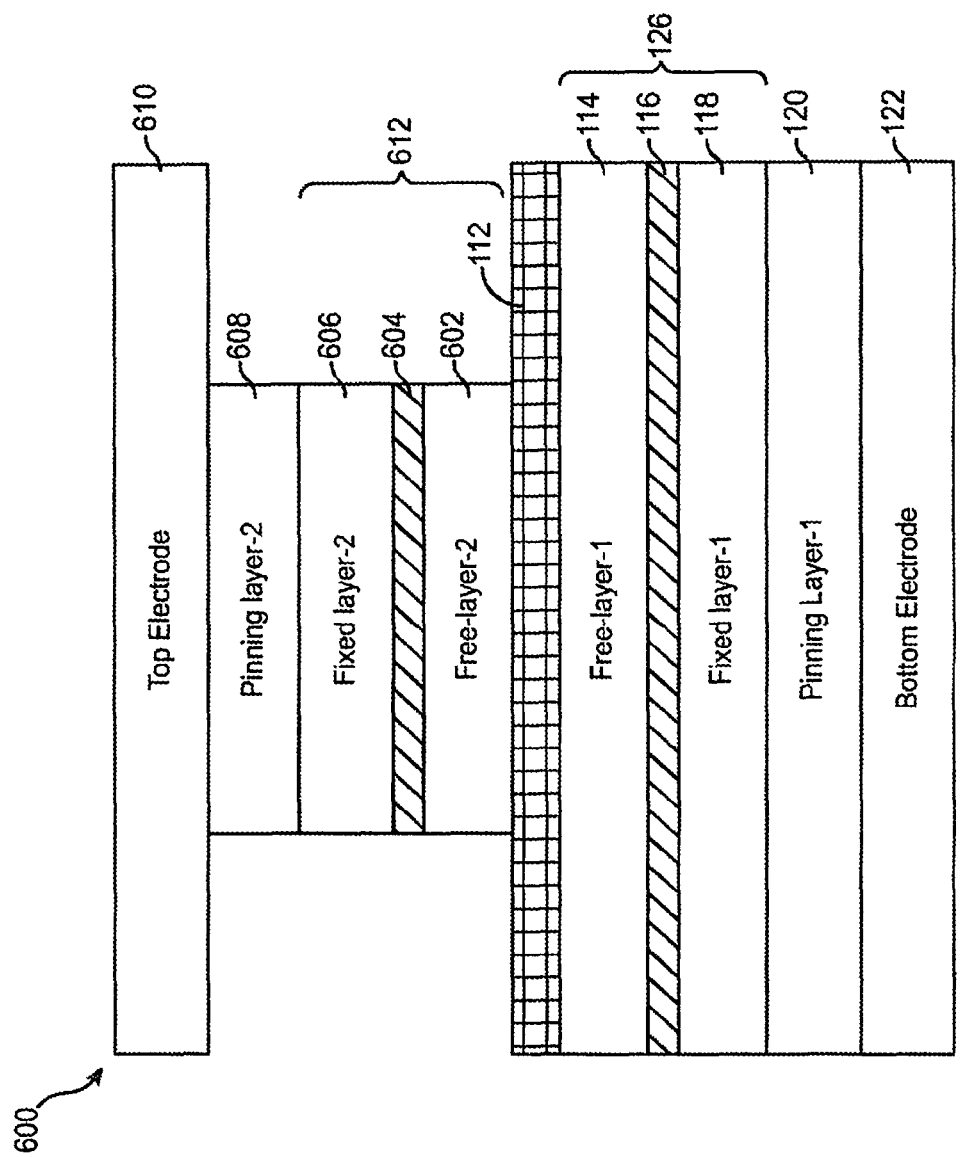

FIG. 5 shows relevant layers of a multi-state current-switching magnetic memory element 600 in accordance with another embodiment of the present invention.

Figure 6:
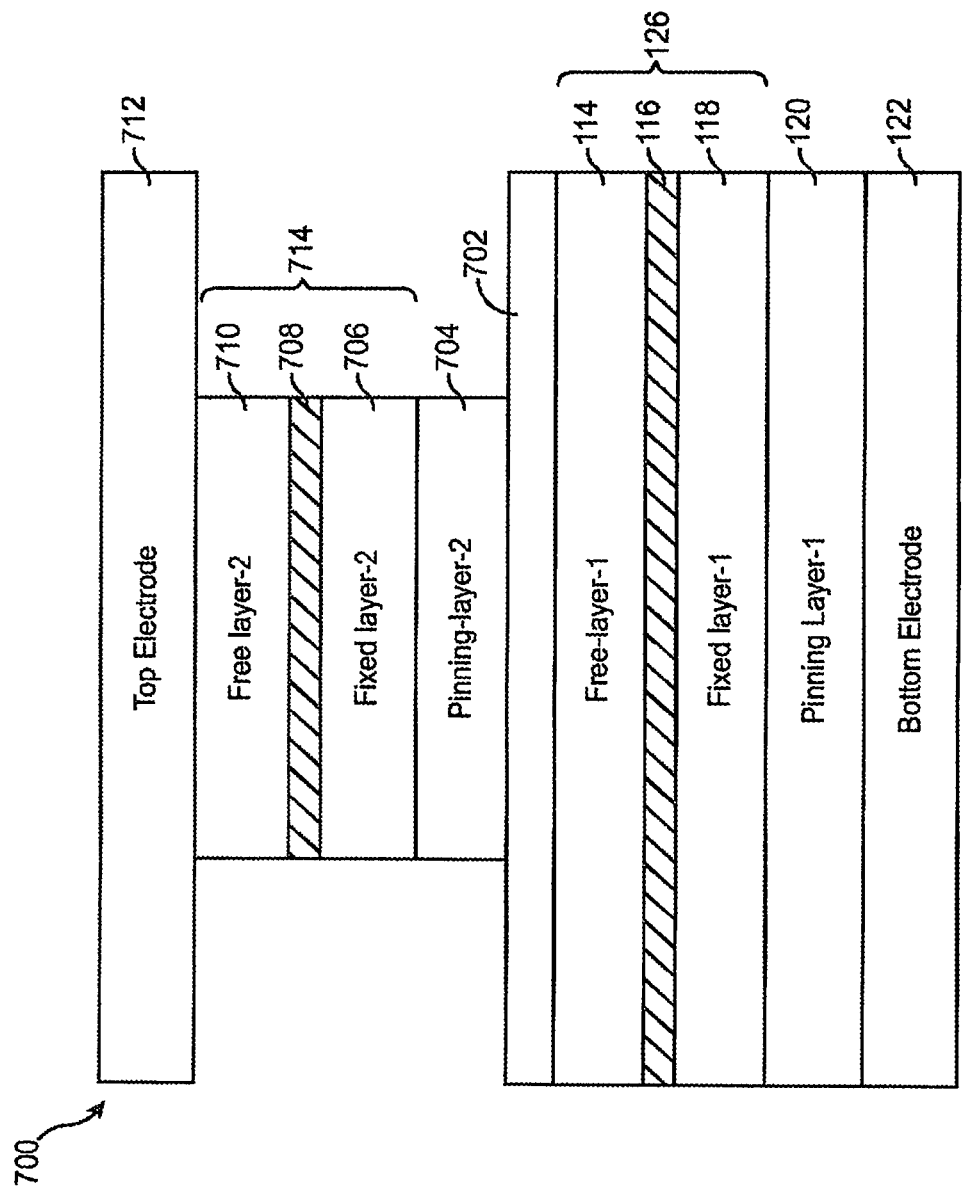

FIG. 6 shows relevant layers of a multi-state current-switching magnetic memory element 700 in accordance with yet another embodiment of the present invention.

Figure 7:
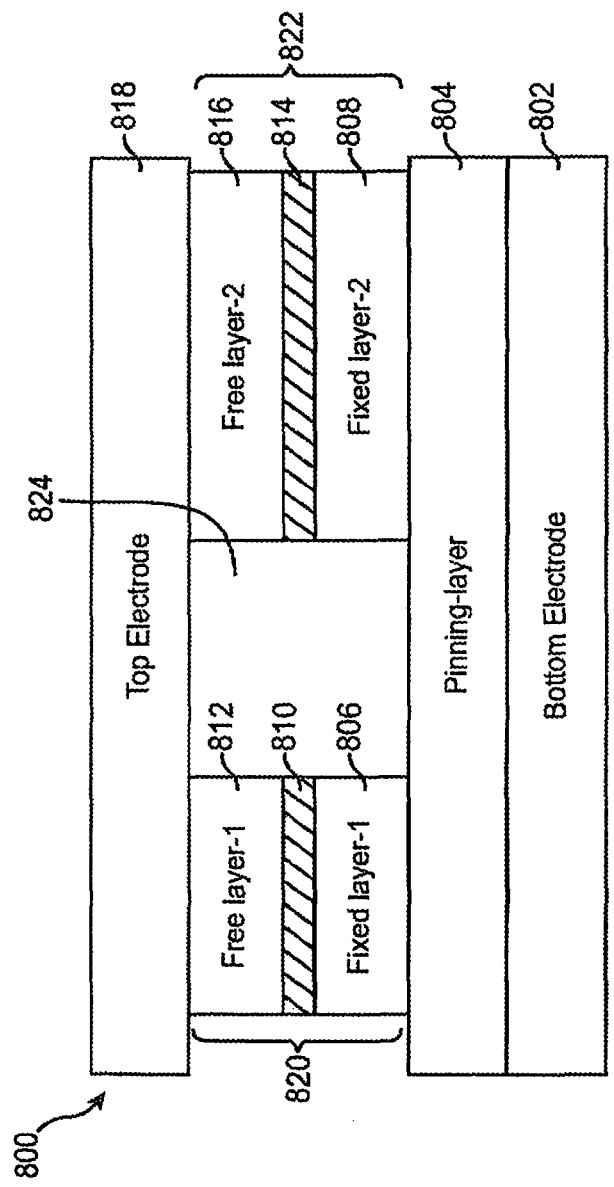

FIG. 7 shows relevant layers of a multi-state current-switching magnetic memory element 800 in accordance with still another embodiment of the present invention.

Figure 8:
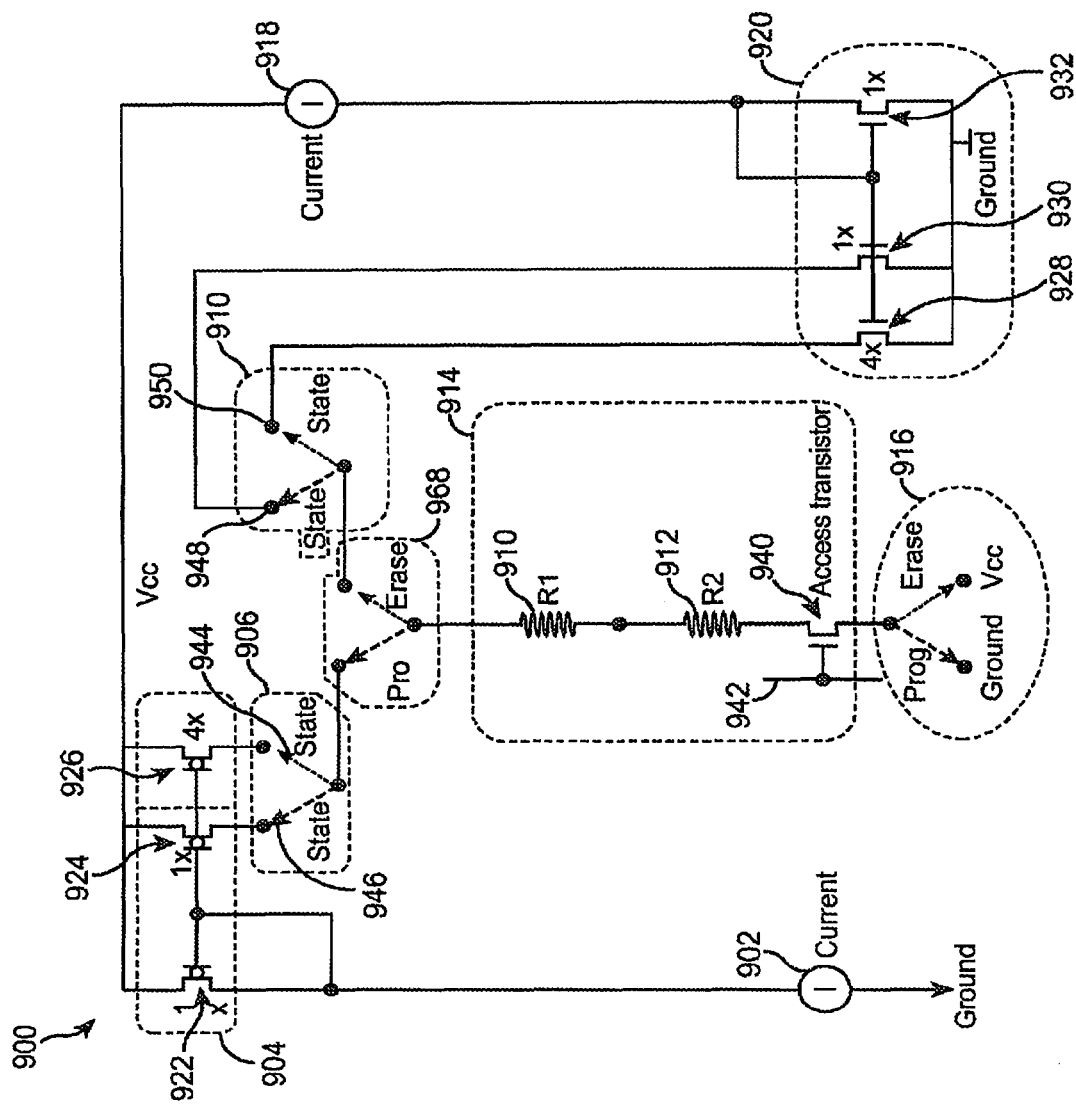

FIG. 8 shows a program/erase circuit for programming and/or erasing the memory elements of the various embodiments of the present invention.

Figure 9:
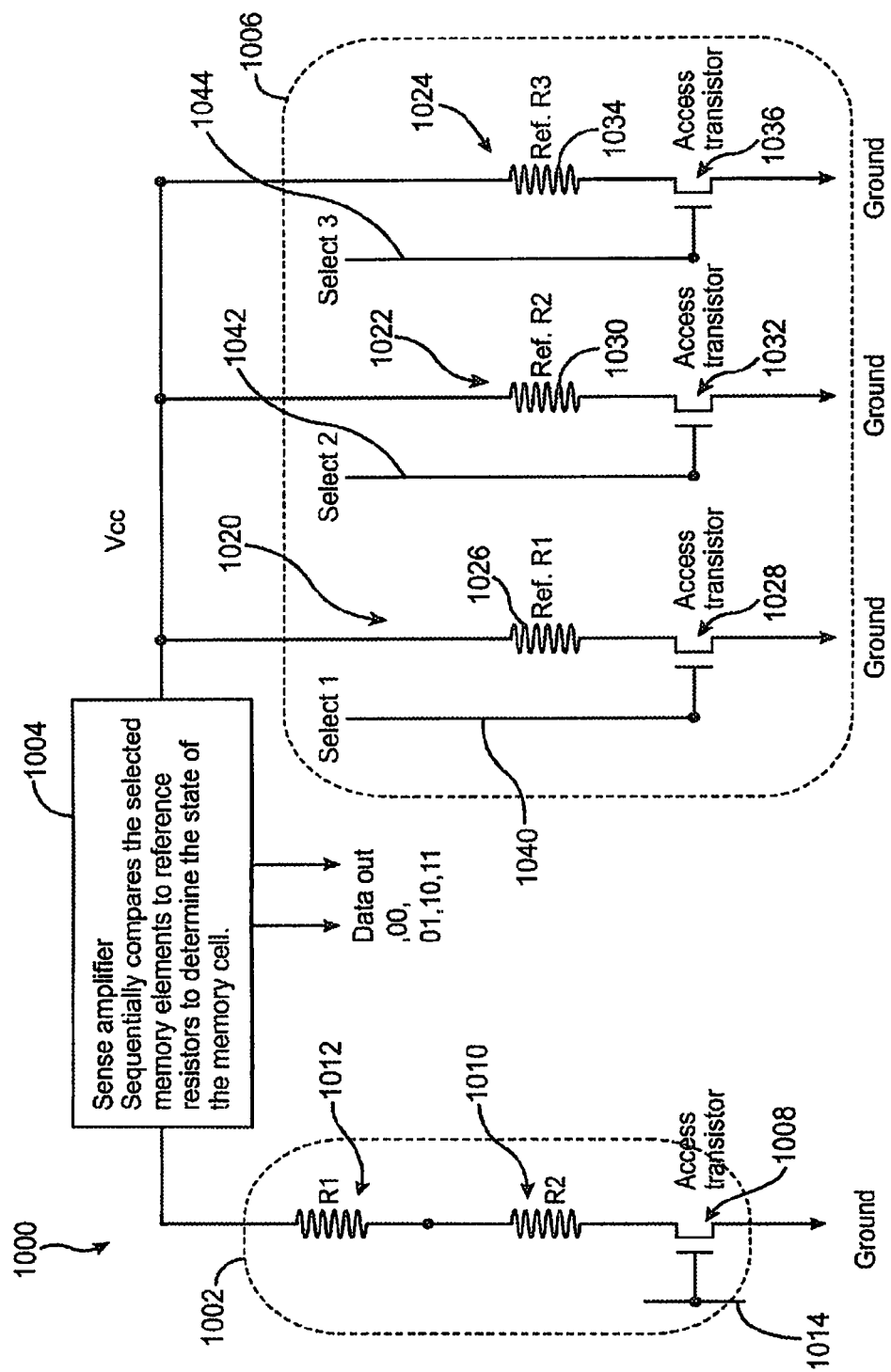

FIG. 9 shows a read circuit for reading the memory elements of the various embodiments of the present invention.

Figure 10:
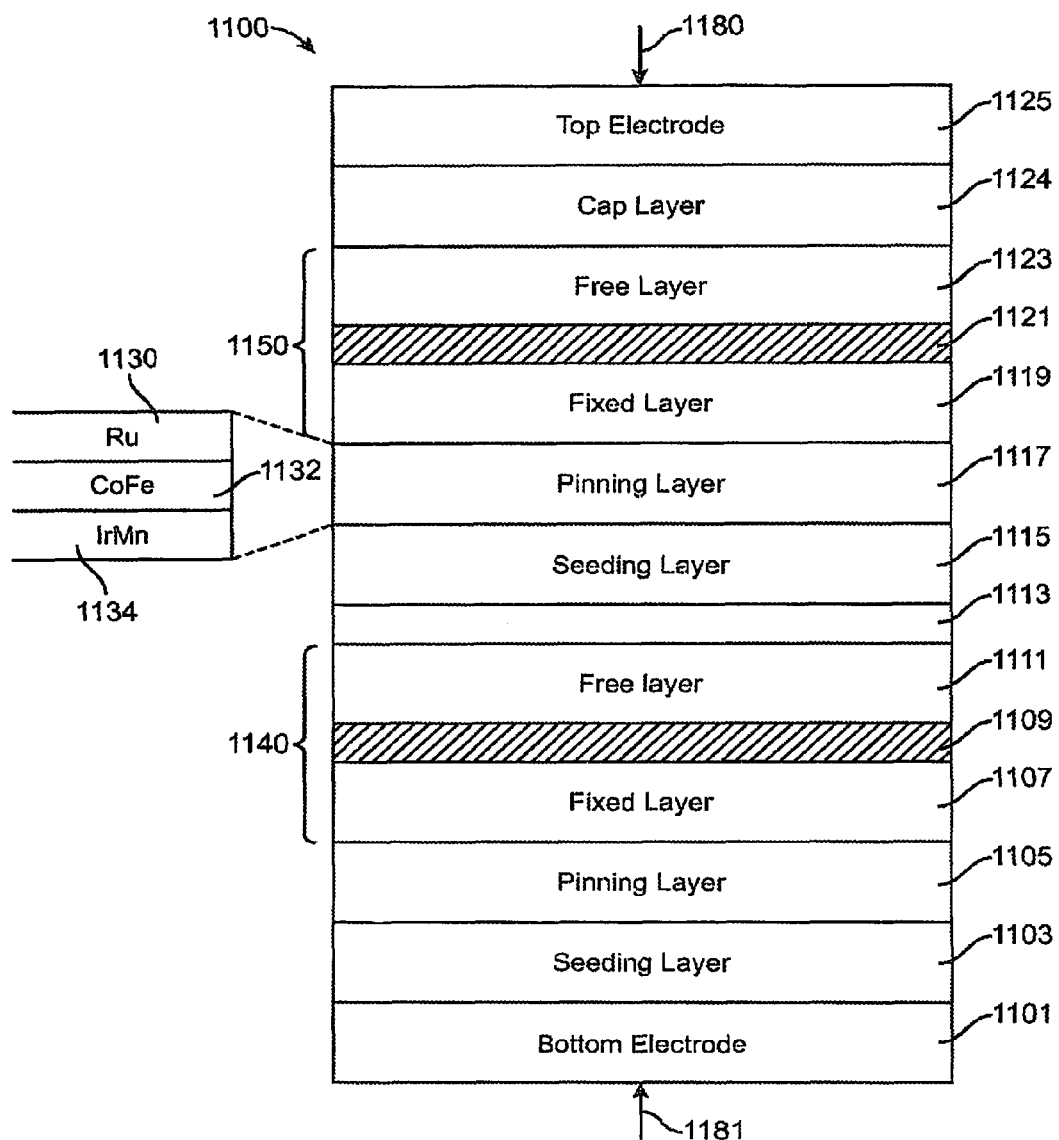

FIG. 10 shows the relevant layers of a multi-state current-switching magnetic memory element 1100 in accordance with an embodiment of the present invention.

Figure 11A:
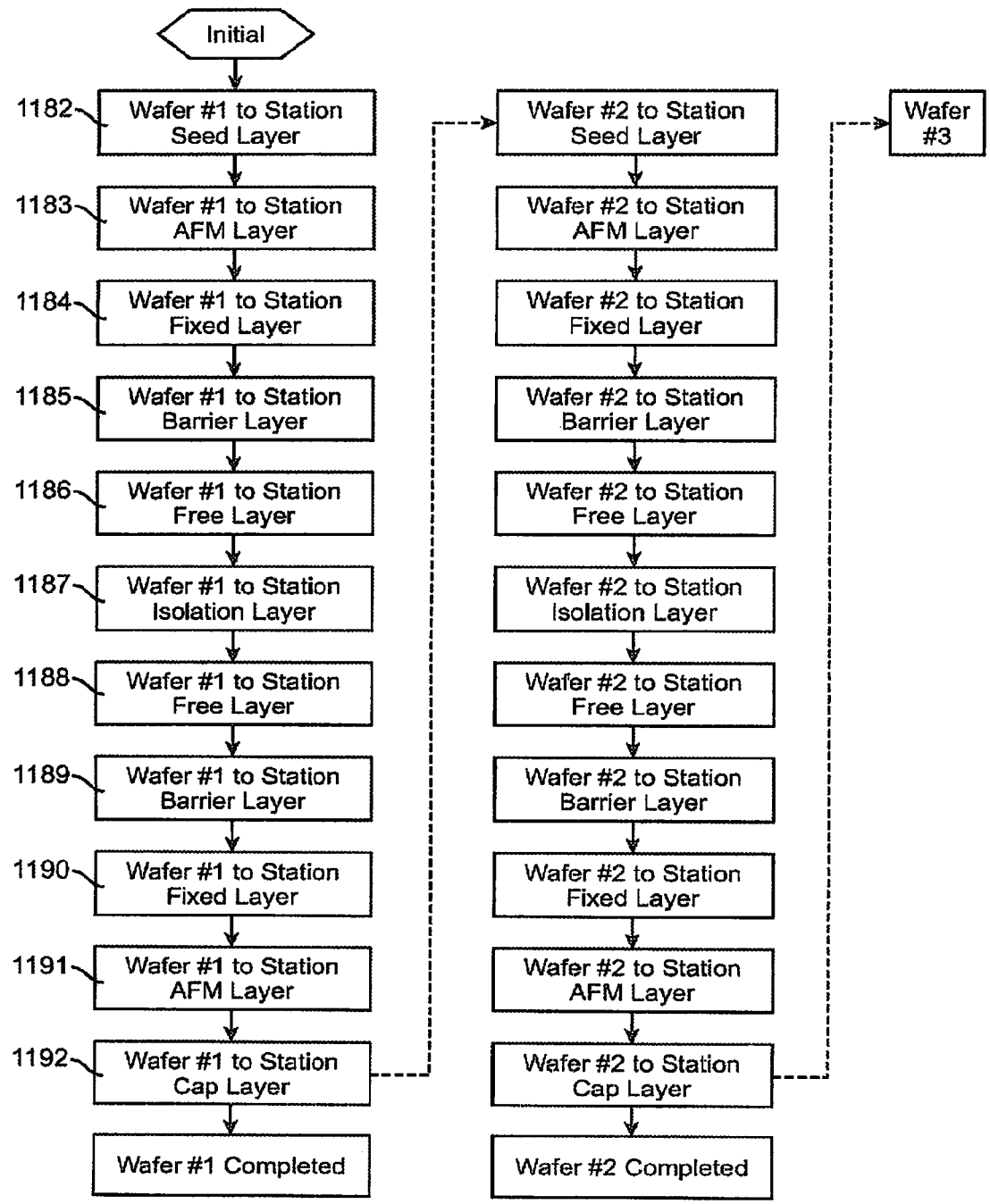

FIGS. 11(a) and (b) show the problems inherent to the manufacturing of earlier memory elements having mirrored MTJs.

Figure 12A:
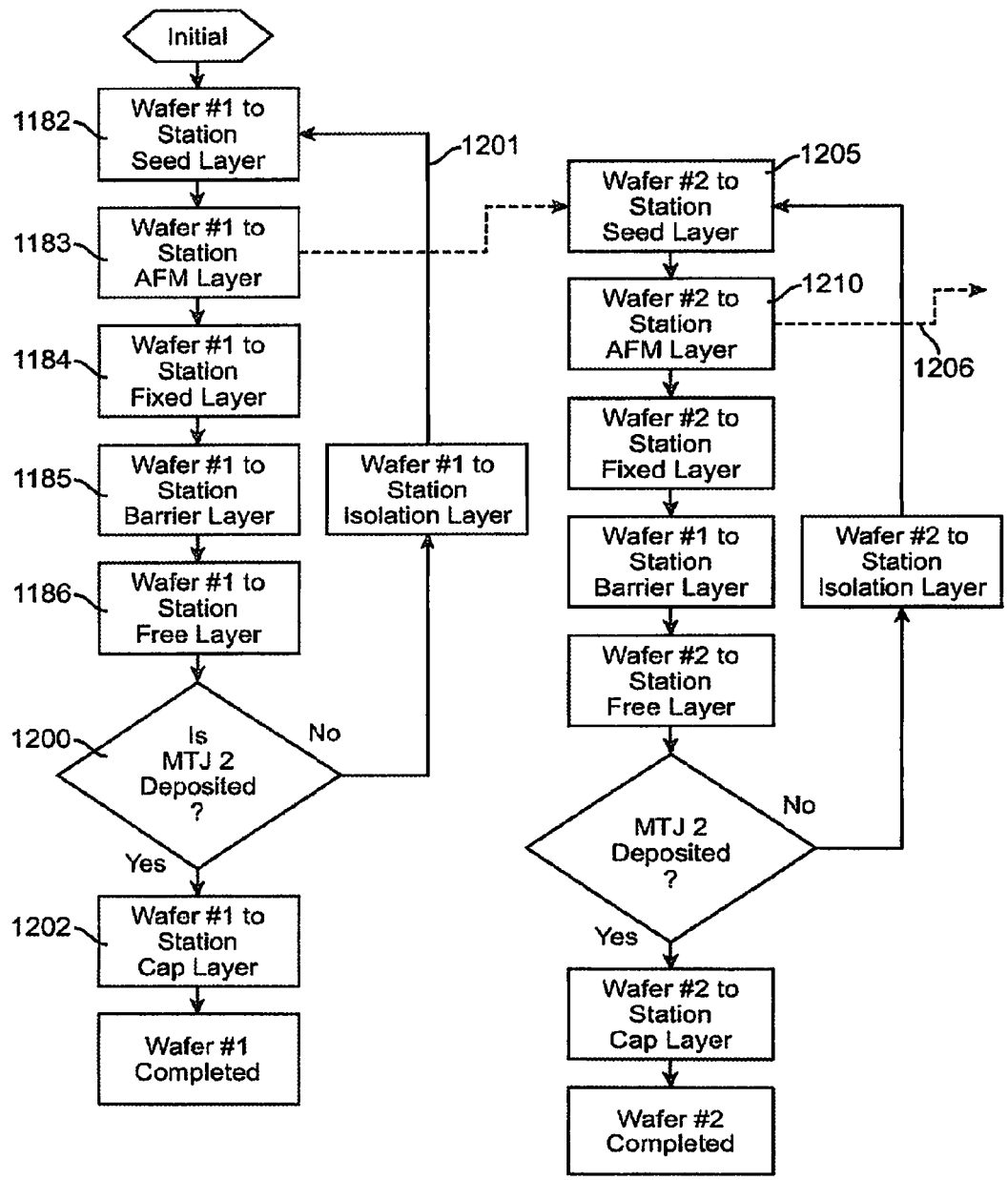

FIGS. 12(a) and (b) show the manufacturing efficiency benefits of the method of manufacturing of an embodiment of the present invention.

FIGS. 13(a)-(e) show Tables 1-5, respectively.

DETAILED DESCRIPTION OF VARIOUS EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized, because structural changes may be made without departing from the scope of the present invention.

In an embodiment of the present invention, a multi-state magnetic memory cell is disclosed. A stack of magnetic tunnel junctions (MTJs) are formed, with each MTJ of the stack formed of a fixed layer, a barrier layer, and a free layer. The fixed layer's magnetic polarity is static, or "fixed," by an adjacent "pinning layer," while the free layer's magnetic polarity can be switched between two states by passing an electrical current through the MTJ. Depending on the magnetic polarity or state of the free layer relative to the fixed layer, the MTJ is either in a "0" or a "1" state.

The individual MTJs are stacked upon each other, and are separated from MTJs that are above or below by an isolation layer. At the top of the top-most MTJ and at the bottom of the bottom-most MTJ are electrodes, which serve to pass the electrical current through the stack for programming, erasing, and reading operations. Each collective of MTJs is oriented in a vertical manner, and is known as a stack or memory element. All neighboring stacks are created by the same steps of the same process (i.e. the stepwise addition of layers), and only become individual stacks after an etching step in the manufacturing process, whereby fractions of each layer are physically removed at precise spacing intervals, creating the stack structures.

The memory element disclosed herein reduces the number of manufacturing steps, manufacturing time, and consequently manufacturing costs, while increasing the consistency and reliability relative to MTJs within a stack.

In prior embodiments of multi-state magnetic memory elements, the mirrored layer order of the bottom stacks and top stacks required that each MTJ undergoes a unique series of otherwise identical layering steps (i.e. step 1, step 2, step 3 to form MTJ 1; but step 3, step 2, step 1 to form MTJ 2), or to manufacture MTJ 1 and MTJ 2 side-by-side and then institute a mid-manufacturing etching step, thus requiring two unique passes of the etching equipment (see U.S. patent application Ser. No. 11/678,515, entitled "A High Capacity Low Cost Multi-State Magnetic Memory," filed on Feb. 23, 2007, by Ranjan et al. for more detail in this respect). This problem is better illustrated in FIGS. 11(a) and (b).

Figure 1:
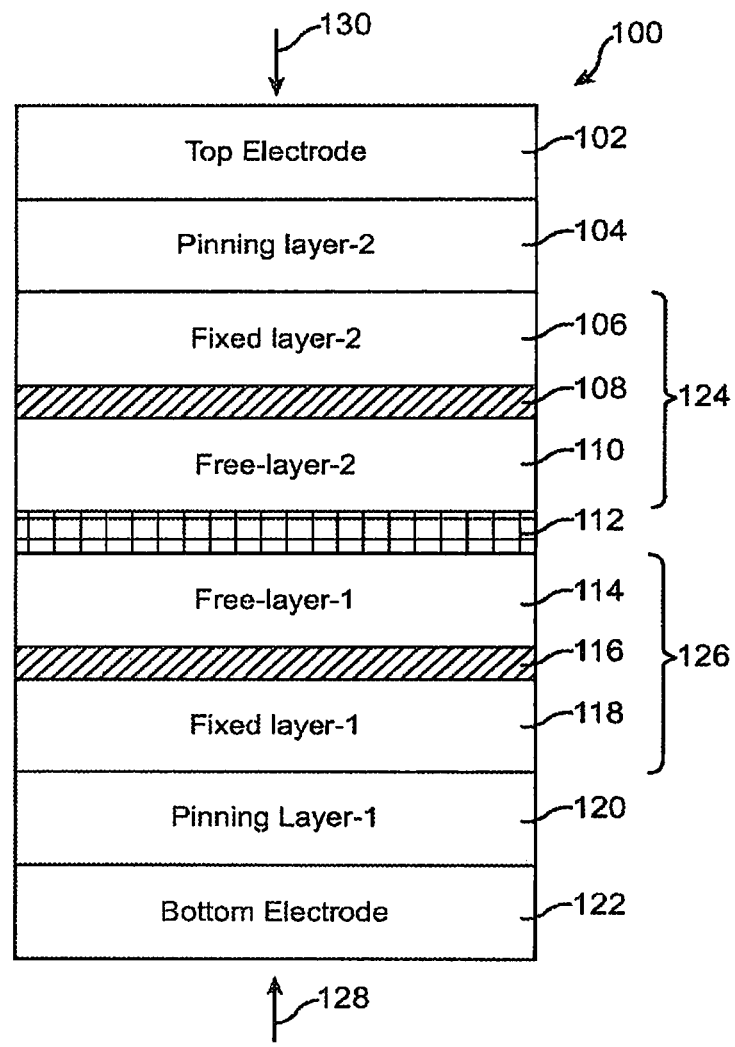
FIG. 1 shows relevant layers of a multi-state current-switching magnetic memory element 100 in accordance with an embodiment of the present invention.

Referring now to FIG. 1, relevant layers of a multi-state current-switching magnetic memory element 100 are shown in accordance with an embodiment of the present invention. The memory element 100 is shown to include a bottom electrode 122, on top of which is shown formed a pinning layer 120, on top of which is shown formed a fixed layer 118, on top of which is shown formed a barrier layer 116, on top of which is formed a free layer 114, on top of which is shown formed a non-magnetic layer 112, on top of which is shown formed a free layer 110, on top of which is shown formed a barrier layer 108, on top of which is shown formed a fixed layer 106, on top of which is shown formed a pinning layer 104, on top of which is shown formed a top electrode 102. The top electrode 102 and the bottom electrode 122 are each made of tantalum (Ta) in an exemplary embodiment although other suitable materials are contemplated. The layers 114, 116 and 118 are shown to form an MTJ 126 separated by the layer 112 from an MTJ 124, which is formed from the layers 106, 108 and 110. The MTJs 124 and 126 form the relevant parts of a stack of memory elements. In fact, while two MTJs are shown to form the stack of FIG. 1, other numbers of MTJs may be stacked for storing additional bits of information.

In FIG. 1, the MTJ 126 is for storing a bit of information or two states, "1" and "0", while the MTJ 124 is for storing another bit of information and since each bit represents two binary states, i.e. "1" and "0", two bits represent four binary states, generally represented as "00", "01", "10", "11", or 0, 1, 2 and 3 in decimal notation, respectively. The memory element 100 advantageously stores two bits of information thereby decreasing the real estate dedicated for memory and further increases system performance. This is particularly attractive for embedded memory applications. Additionally, manufacturing is made easier and less costly and scalability is realized.

In FIG. 1, the barrier layer of each of the MTJs, such as the layer 116, acts as a filter for electrons with different spins, giving rise to different amounts of tunneling current for electrons with different spins, thereby causing two unique resistance values associated with each MTJ for two different orientations of the free layer. In the case where additional MTJs are employed, each MTJ similarly has associated therewith a unique resistance value.

In one embodiment of the present invention, the thicknesses of the layers 108 and 116 cause the MTJs 124 and 126 to have different resistances and therefore capable of storing more than one bit.

Examples of materials used to form each of the layers of the memory element 100 will now be presented. It should be noted that these materials are merely examples and other types of materials may be employed. The layers 104 and 120, are each typically formed substantially of IrMn or PtMn or NiMn or any other material including manganese (Mn). The layers 106 and 118 are each typically formed substantially of a magnetic material. Examples of such magnetic material include CoFeB or CoFe/Ru/CoFeB. The layers 108 and 116 are each made substantially of a non-magnetic material, an example of which is magnesium oxide (MgO). The layer 112 is a non-magnetic layer made substantially of, for example, NiNb, NiP, NiV or CuZr.

The layer 112 serves to insulate the two MTJs 124 and 126 from one another. In an embodiment employing more than two MTJs, another layer, such as the layer 112 would be formed on top of the layer 104 or on the bottom of the layer 120. The layers 110 and 114 are each made of CoFeB containing oxides intermixed. The layers 110 and 114 are substantially amorphous in an at-deposited state. The top electrode 102 and the bottom electrode 122 are each made of tantalum (Ta) in one embodiment of the present invention. However, other types of conductive material may be employed.

The layers 120 and 104 are anti-ferromagnetic (AF) layers. More specifically, for example, the magnetic moment of the layer 104 helps to pin the magnetic moment of the layer 106. Similarly, the magnetic moment of the layer 120 serves to pin the magnetic moment of the layer 118. The magnetic moment of each of the layers 120 and 104 is permanently fixed.

Other choices of materials for the layers 108 and 116 are aluminum oxide ($Al_2O_3$) and titanium oxide ($TiO_2$). A thin layer of one of the constituent elements may be deposited prior to the deposition of the barrier oxide layer. For example, a 2-5 Å thick Mg layer may be deposited prior to the deposition of the layers 108 and 116. This limits any damage of the magnetic free layer from intermixing of the elements during deposition. The layer 112 is a non-magnetic layer, which is substantially amorphous, made of, for example, nickel-niobium (NiNb), nickel-phosphorous (NiP), nickel-vanadium (NiV), nickel-boron (NiB) or copper-zirconium (CuZr). It should be noted that the compositions of these alloys are chosen in such a way that the resulting alloys become substantially amorphous. For example, for nickel-niobium (NiNb), the typical Nb content is maintained between 30 to 70 atomic percent, and for nickel-phosphorous (NiP), the phosphorous (P) content is maintained between 12 and 30 atomic percent. The layer 112 serves to isolate the two MTJs 124 and 126 from one another. In an embodiment of the present invention, which employs more than two MTJs, another layer, such as the layer 112, would be formed on top of the layer 104 or on the bottom of the layer 120. The layers 110 and 114 are each made of CoFeB containing oxides intermixed. The layers 110 and 114 are substantially amorphous in an as-deposited state. The top and the bottom electrodes are typically made of tantalum (Ta).

The layers 120 and 104 are anti-ferromagnetic (AF) layers. More specifically, for example, the magnetic moment of the layer 104 helps to pin the magnetic moment of the layer 106. Similarly, the magnetic moment of the layer 120 serves to pin the magnetic moment of the layer 118. The magnetic moment of each of the layers 120 and 104 is permanently fixed. This is typically done by a magnetic annealing process following the deposition of all the layers and involves heating the whole wafer under the application of a substantially uni-axial magnetic field of over 5 kOe and a temperature of over 350 degrees centigrade for typically 2 hours. This annealing process also serves to re-crystallize the layers 108 and 116 and their respective adjacent free layers 110 and 114. This process is essential for making high performing magnetic tunnel junction.

Typical thicknesses of the layers of the memory element 100 are now presented. However, these sizes are merely examples, as other thicknesses are anticipated. A typical thickness of each of the top electrode 102 and the bottom electrode 122 is 30 to 200 nm. While a preferred thickness is typically 50 nm, the actual thickness choice may depend on the requirements from the metallization process. The layers 104 and 120 are typically 20 to 100 nm in thickness with a preferred thickness of 25-50 nm. The layers 106 and 118 are typically made of three layers of cobalt-iron (CoFe)/ruthenium (Ru)/cobalt-iron-boron (CoFeB) with CoFe layer being placed adjacent to the layers 104 and 120. The typical thickness of the CoFe layer is 3 to 10 nm. Ru layer is 0.6 to 1.0 nm to create anti-ferromagnetic coupling between the two adjacent magnetic layers of CoFe and CoFeB. The CoFeB layer is typically 2 to 10 nm thick with a preferred range of 2.5 to 5 nm. The free layers 110 and 114 are typically 2 to 7 nm thick with a preferred range of 2-5 nm and may contain a 1-2 nm thick layer of Co—Fe-oxide inter-dispersed in that layer in order to get low switching current during current induced switching. The barrier layers 108 and 116 are typically 0.8 to 3 nm. It is very likely that the two barrier layers may have slightly different thicknesses. For example, layer 116 can be 1.5 to 2.5 nm thick while the second barrier layer 108 may be 0.8 to 1.2 nm thick, and vice-versa. Additionally, the thicknesses and the amounts of oxide in the free layers 110 and 114 may be different by a factor of 1.5 or higher. The amorphous isolation layer 112 is typically 2 to 50 nm thick with a preferred range being 2 to 10 nm. It should be pointed out that while the most preferred choice for the non-magnetic isolation layer is an amorphous non-magnetic alloy, a crystalline non-magnetic alloy may also work.

During manufacturing, the layers of the memory element 100 are formed in the manner described hereinabove. Additionally, an annealing process, which is well known, is performed by heating the memory element 100 in the presence of a magnetic field, after which channels are formed in each of the layers 108 and 116. Following the annealing process, the fix layers are oriented in a particular orientation and the layers 108 and 116 as well as the layers 110 and 114 take on a crystalline characteristic.

During operation, a current is applied, in a perpendicular direction relative to the plane of the paper of FIG. 1, either from a direction indicated by the arrow 128 or a direction indicated by the arrow 130. When the current is applied, depending on the level of the current, the magnetic moment of each of the layers 110 and 114 is caused to be switched to an opposite direction, or not. Since the MTJs 124 and 126 are made with different aspect ratios (or anisotropy), the switching current is different for these two MTJs. For example, in one embodiment of the present invention, the aspect ratio for MTJ 124 is approximately 1:1.3 to 1:1.5 while the aspect ratio for the MTJ 126 is approximately 1:2 to 1:2.5. Therefore, the switching current for the MTJ 126 is 3-5 times higher than that of the MTJ 124 in the foregoing embodiment. At high current levels both MTJs switch magnetic orientation, while at low current levels only the MTJ 124 having the smaller aspect ratio switches.

The state of the magnetic moment of each of the layers of the MTJ defines the state of the memory element 100. As the layers 104 and 120 each act as AF coupling layers, they pin or switch the magnetic moments of the their neighboring fixed layer, which then, by the application of current, causes neighboring free layers to switch or not. More specifically, the layer 118 defines one state, the layer 114 defines another state, the layer 110 defines yet another state and the layer 106 defines still another state. For the sake of understanding, the states of the layers 118, 114, 110 and 106 are referred to as states 1, 2, 3 and 4, respectively.

Figure 2:
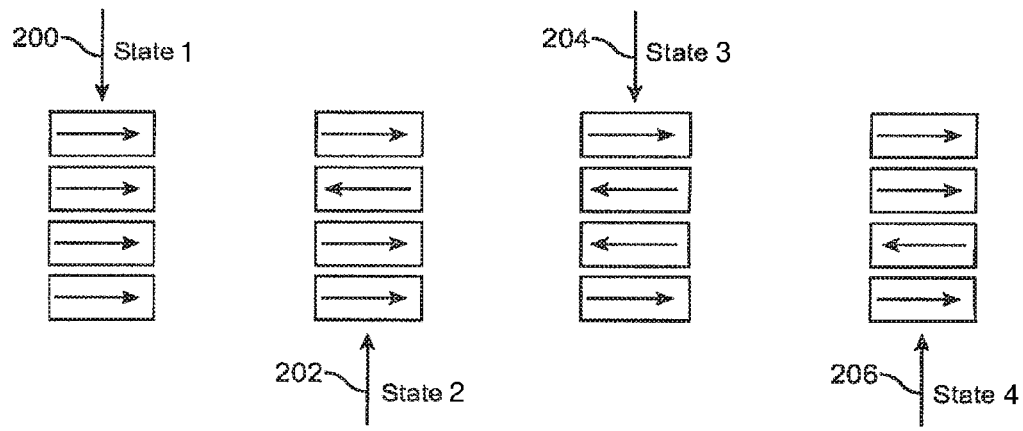
FIG. 2 shows various states of the memory element 100.

FIG. 2 shows various states of the memory element 100. Due to the use of two MTJs, four different states or two bits may be stored. Therefore, the states 1-4 are shown. At each state, the directions of the arrows indicate the directions of the magnetic moments of free layers and fixed layers. The direction of the arrow 200 shows the direction of high current applied to the memory element 100 and in this case, the state of the memory element 100 is at an all "1"s or all "0"s state. The direction of the arrow 202 shows the direction of low current applied to the memory element 100 when at state 1. The direction of the arrow 204 shows the direction of high current applied to the memory element 100 when the latter is at state 2 and the direction of the arrow 206 shows the direction of low current applied to the memory element 100 when at state 3.

FIG. 3 shows a graph of the level of resistance (R) of each of the layers 118, 114, 110 and 106 (shown in the y-axis) vs. the state of the memory element 100. Thus, for example, at 208, the memory element 100 has taken on the state 1 (corresponding to 200 in FIG. 2), at 210, the memory element 100 has taken on the state 4 (corresponding to 206 in FIG. 2), at 212, the memory element 100 has taken on the state 2 (corresponding to 202 in FIG. 2), and at 214, the memory element 100 has taken on the state 3 (corresponding to 204 in FIG. 2). The level of resistance for each of these states is indicated in Table 1, at a column labeled "Total R". For example, at state 1, the R in FIG. 3 is indicated as being 3 kilo ohms (K Ohms) by Table 1. At state 2, the R in FIG. 3 is indicated as being 5 K Ohms and so on. The values used for resistance serve as examples only such that other values may be employed without departing from the scope and spirit of the present invention.

It should be noted that different aspect ratio or anisotropy associated with the different MTJs 124 and 126 causes the different switching of the MTJs, which results in two bits being stored in the memory element 100. In other embodiments, some of which will be shortly presented and discussed, the sizes of the barrier layers of the MTJs are changed to effectuate different resistances. In yet other embodiments, the sizes of the MTJs are changed to the same.

FIG. 4 shows a graph 250 of the tunneling magneto resistance (TMR), shown in the y-axis, vs. the resistance area (RA). The TMR is defined as:

$$TMR = (R_h - R_l)/R_l \quad \text{Eq. (1)}$$

Wherein $R_h$ is resistance at a high state and $R_l$ is resistance at a low state.

The graph 250 of FIG. 4 serves merely as an example to convey the difference in TMR or percentage increase as the RA increases. For instance, at an RA of 2 ohm-micro-meters squared, the TMR is 100% while at an RA of 10, the TMR is 150%, where the thickness of the barrier layer of the MTJ is between 14-24 Angstroms.

FIG. 5 shows relevant layers of a multi-state current-switching magnetic memory element 600 in accordance with another embodiment of the present invention. The memory element 600 is shown to include a bottom electrode 122, on top of which is shown formed a pinning layer 120, on top of which is shown formed a fixed layer 118, on top of which is shown formed a barrier layer 116, on top of which is formed a free layer 114, on top of which is shown formed a non-magnetic layer 112, as that shown in FIG. 1. As previously indicated, relative to FIG. 1, the MTJ 126 comprises the layers 114, 116 and 118. However, in the embodiment of FIG. 5, the MTJ 612, which is made of a free layer 602, a barrier layer 604 and a fixed layer 606, is smaller in its planar dimension than the MTJ 126 of FIG. 1, which causes the MTJ 612 to have a different resistance than that of the MTJ 126.

In FIG. 5, the free layer 602 is shown to be formed on top of the layer 112 and on top of the layer 602 is shown formed the layer 604, on top of which is shown formed the layer 606, on top of which is shown formed a pining layer 608 and a top electrode 610. The MTJs 126 and 612 are shown separated by the layer 112. The MTJs 126 and 612 form the relevant parts of a stack of memory elements. In fact, while two MTJs are shown to form the stack of FIG. 5, other number of MTJs may be stacked for storing additional bits of information.

The difference in the planar dimension of the MTJ 612 to that of the MTJ 126 is approximately 1 to 10 and typically 1 to 3 in one embodiment of the present invention. The material for each of the layers of the memory element 600 may be the same as that of counterpart layers of the memory element 100. For example, the layer 602 is made of the same material as that of the layer 110, and the layer 604 is made of the same material as that of the layer 108, and the layer 606 is made of the same material as the layer 106, and the layer 608 is made of the same material as the layer 104. The top electrodes 610 and 102 are made of the same material. In another embodiment, the MTJ 612 may be larger in size, in the same planar dimension, than the MTJ 126.

The operation of the embodiment of FIG. 5 is the same as that of FIG. 1.

FIG. 6 shows relevant layers of a multi-state current-switching magnetic memory element 700 in accordance with yet another embodiment of the present invention. The memory element 700 includes a bottom electrode 122, on top of which is shown formed a pinning layer 120, on top of which is shown formed a fixed layer 118, on top of which is shown formed a barrier layer 116, on top of which is formed a free layer 114, on top of which is shown formed a non-magnetic layer 112, as those shown in FIGS. 1 and 6. As previously indicated, relative to FIGS. 1 and 6, the MTJ 126 comprises the layers 114, 116 and 118. However, in the embodiment of FIG. 6, the MTJ 714, which is shown to comprise a free layer 706, a barrier layer 708 and a fixed layer 710, is shown to be smaller in its planar dimension than the MTJ 126, causing the MTJ 710 to have a different resistance than that of the MTJ 126.

The MTJs 126 and 714 are shown separated by the layers 702 and 704. The layer 704 serves to pin the layer 706, while the layer 702 serves to isolate the MTJ 126 and is an amorphous material on top of the layer 114. The layer 702, in one embodiment of the present invention, is made of two non-magnetic layers, such as Ta and/or an amorphous alloy, the same as nickel niobium (NiNb) or nickel-phosphorus (NiP). The MTJs 126 and 714 form the relevant parts of a stack of memory elements. In fact, while two MTJs are shown to form the stack of FIG. 6, other numbers of MTJs may be stacked for storing additional bits of information.

The difference in the planar dimension of the MTJ 714 to that of the MTJ 126 is 1 to 10, and typically 1 to 3 in one embodiment of the present invention. The materials for the layers of the memory element 700 may be the same as the counterpart layers of the memory element 100 or those of the memory element 600. For example, the layer 710 is made of the same material as that of the layer 110, and the layer 708 is made of the same material as that of the layer 108, and the layer 706 is made of the same material as the layer 106, and the layer 704 is made of the same material as the layer 104. The top electrodes 712 and 102 are made of the same material. In another embodiment, the MTJ 714 may be larger in size, in the same planar dimension, than the MTJ 126.

FIG. 7 shows relevant layers of a multi-state current-switching magnetic memory element 800 in accordance with still another embodiment of the present invention. In FIG. 7, the memory element 800 is shown to include a bottom electrode 802, on top of which is shown formed a pinning layer 804, on top of which is shown formed two fixed layers on either side thereof. That is, a fixed layer 806 is formed on one side of the layer 804 and a fixed layer 808 is formed on an opposite side of the layer 804.

In FIG. 7, two MTJs are formed on either side on top of the layer 804. Namely, an MTJ 820 is formed on one side of the layer 804 and another MTJ 822 is formed on an opposite side of the layer 804. The MTJ 820 includes the fixed layer 806, which is formed on top of the layer 804, and the barrier layer 810 formed on top of the layer 806, and the free layer 812 formed on top of the layer 810. The MTJ 822 is shown to include the fixed layer 808, which is formed on top of the layer 804, and the barrier layer 814, which is formed on top of the layer 808, and the free layer 816, which is formed on top of the layer 814. A top electrode 818 is formed on top of the MTJs 820 and 822 or more specifically on top of the layers 812 and 816. The top electrode 818 is typically made of two layers, such as Ta and a conductive, non-magnetic material.

In forming the memory element 800, the layer 804 is formed on top of the bottom electrode, and the layers of the MTJs 820 and 822 are formed on top of the layer 804, and on top of the MTJs 820 and 822 is formed the top electrode 818. The layers of the MTJs 820 and 822 are formed uniformly and continuously on top of the layer 804, and a trench 824, which is basically an empty space or hole, is formed prior to depositing the top electrode 818 by etching through the layers of the MTJs 820 and 822. In this manner, the fixed layers of the MTJs 820 and 822 are the same layer prior to etching and the barrier layers of the MTJs 820 and 822 are the same layer prior to etching and the free layers of the MTJs 820 and 822 are the same layer prior to etching.

In one embodiment of the present invention, the trench 824 is filled with a dielectric material, such as silicon dioxide ($SiO_2$) or silicon nitride ($SiN_x$) to enhance stability.

After etching, the top electrode 818 is deposited or formed on top of the MTJs 820 and 822. The embodiment of FIG. 7, as the embodiments of FIGS. 6, 5 and 1 store two bits of information, one bit in each MTJ. Thus, the MTJ 820 is for storing one bit and the MTJ 822 is for storing another bit of information. However, more bits may be stored by adding MTJs. In FIG. 7, additional MTJs may be added on top of the layer 804 or the MTJs 820 and 822. With the addition of MTJs, beyond that which is shown in FIG. 7, additional notches or spaces are formed between the MTJs, such as the space or notch 824.

Table 2 shows certain exemplary characteristics of the embodiment of FIG. 7. It should be noted that similarly, Table 1 shows certain exemplary characteristics of the embodiments of FIGS. 1, 5 and 6.

For example, in Table 2, under the "Total R" column, the resistance at each state of the memory element 800, such as the state 1, the state 2, the state 3 or the state 4 is shown. As previously noted, each state represents a binary value such that four states represented by two bits are stored. The programming current, in micro amps, i.e. the current needed to program the memory element 800 to a given state, is indicated in the last column of Table 2, under the label "Prog I".

In an alternative embodiment of the present invention, a non-uniform switching based non-volatile magnetic memory element, such as the non-uniform switching based non-volatile magnetic memory element 100 disclosed in U.S. patent application Ser. No. 11/674,124 entitled "Non-Uniform Switching Based Non-Volatile Magnetic Base Memory", filed on Feb. 12, 2007, may be employed to replace the MTJs of the various embodiments shown and discussed herein. For example, the MTJ 124 or the MTJ 126 may be replaced with a non-uniform switching based non-volatile magnetic memory element. Other MTJs discussed herein may also be replaced with non-uniform switching based non-volatile magnetic memory element. This advantageously further reduces the requisite switching current to enhance system performance.

FIG. 8 shows a program/erase circuit for programming and/or erasing the memory elements of the various embodiments of the present invention. In FIG. 8, a current source 902 is shown coupled to a current mirror circuit 904, which is shown coupled to a switch 906, which is, in turn, shown coupled to a switch 968, which is shown coupled to a multi-state current-switching magnetic memory cell 914, which is shown coupled to a switch 916. Further shown in FIG. 8, a current source 918 is coupled to a current mirror circuit 920 and further coupled to Vcc on an opposite end thereto. The circuit 920 is further shown coupled to a switch 910.

The circuit 904 is shown to include a P-type transistor 922, a P-type transistor 924 and a P-type transistor 926. The source of each of the transistors 922, 924 and 926 is shown coupled to Vcc. Vcc is at a predetermined voltage level that is higher than ground. The gate of the transistor 922 is shown coupled to the current source 902 and the opposite side of the current source 902 is shown coupled to ground. The drain of the transistor 922 is shown coupled to its gate as well as to the gate of the transistor 924 and the gate of the transistor 926. The drains of the transistors 924 and 926 are shown coupled to the switch 906. The memory cell 914 is shown to include an MTJ 910, an MTJ 912 and an access transistor 940. The MTJ 910 is shown coupled in series to the MTJ 912, which is shown coupled to the drain of the transistor 940. The gate of the transistor 940 is shown coupled to a word line 942. The word line 942 selects a memory cell. The source of the transistor 940 is shown coupled to the switch 916.

The circuit 920 is shown to include an N-type transistor 928, an N-type transistor 930 and an N-type transistor 932. The sources of the transistors 928, 930 and 932 are shown coupled to ground. The gate of the transistor 932 is coupled to the current source 918, and is further coupled to the drain of the transistor 932, and is further coupled to the gate of the transistor 930 as well as to the gate of the transistor 928. The drains of the transistors 930 and 928 are shown coupled to the switch 910.

Each of the switches 968 and 916 is shown operative to switch between two states, a program state and an erase state. The switches 906 and 910 are shown operative to switch between two states.

The MTJs 910 and 912 are similar to the MTJs of previous figures, such as those depicted in FIGS. 1 and 6. In an alternative embodiment, the MTJs 910 and 912, coupled in parallel, would be similar to the MTJs shown in FIG. 7. Each of the MTJs 910 and 912 possesses a resistance of a different or unique value. The difference in their resistance results from the difference in the aspect ratio or size or anisotropy of the MTJs.

The size of the transistor 926 is greater than the sizes of the transistors 922 and 924. Similarly, the size of the transistor 928 is greater than the sizes of the transistors 930 and 932. In one embodiment of the present invention, the size difference of the foregoing transistors is 4 to 1. To explain the operation of programming, an example is provided with fixed values but it should be noted that these values may be altered without departing from the scope and spirit of the present invention.

In operation, to program the memory cell 914 to a state 1, a current of level of 50 micro Amps is applied by the current source 902 to the circuit 904, which is amplified to 4× the current level or 200 microAmps, as shown in Table 1 because the transistor 926 is able to drive this level of current. This causes the switch 906 to switch to the state indicated at 944. The switch 968 is set to "program" state, as is the switch 916, which causes the 200 micro amp current to flow through the MTJs 910 and 912, and the transistor 940 is selected by raising the voltage on the word line 942. This results in programming of state 1. The magnetic moments of the free layers of the MTJs 910 and 912 will be caused to be aligned with the magnetic moments of their respective fixed layers. This results in the lowest resistance of the memory cell 914, as indicated in Table 1.

In programming the memory cell 914 to a state 2, a current of level of 50 micro Amps is applied by the current source 918 to the circuit 920, which is the same current level as that generated by the circuit 920. The current level for state 2 is indicated in Table 1. The switch 910 is caused to be switched to the state indicated at 948. The switches 968 and 916 are both set to "erase" state, which causes the 50 micro amp current to flow through the MTJs 910 and 912, and the transistor 940 is selected by raising the voltage on the word line 942. This results in programming of state 2. The magnetic moment of the free layer of the MTJ 910 is caused to be switched to an anti-parallel state or a state that is in opposite to being aligned with its respective fixed layer. The MTJ 912 remains in the state it was in at state 1. The reason for this is, that in one embodiment of the present invention, with the aspect ratio of the MTJ 912 being higher than that of MTJ 910, it is prevented from switching. This results in the resistance of the memory cell 914 indicated in Table 1.

In programming the memory cell 914 to a state 3, a current of level of 50 micro Amps is applied by the current source 918 to the circuit 920, which causes the current level, generated by the transistor 928 to be 4 times that of the level of the current source, or 200 micro amps. The current level for state 3 is indicated in Table 1. The switch 910 is caused to be switched to the state indicated at 950. The switches 968 and 916 are both set to "erase" state, which causes the 200 micro amp current to flow through the MTJs 910 and 912, and the transistor 940 is selected by raising the voltage on the word line 942. This results in programming of state 3. The magnetic moments of the free layers of the MTJs 910 and 912 are caused to be switched to an anti-parallel state relative to their respective fixed layers. This results in the resistance of the memory cell 914 to be that indicated in Table 1.

To program the memory cell 914 to a state 4, a current of level of 50 micro Amps is applied by the current source 902 to the circuit 904, which is the current level of the circuit 904 and that which is indicated in Table 1 for state 4. This causes the switch 906 to switch to the state indicated at 946. The switch 968 is set to "program" state, as is the switch 916, which causes the 50 micro amp current to flow through the MTJs 910 and 912, and the transistor 940 is selected by raising the voltage on the word line 942. This results in programming of state 4. The magnetic moment of the free layer of the MTJ 910 will be caused to be aligned with the magnetic moment of its respective fixed layer. The MTJ 912 remains in its anti-parallel state. The reason for this is due to different aspect ratios of the two MTJs as discussed hereinabove. This results in a resistance of the memory cell 914 indicated in Table 1.

FIG. 9 shows a read circuit for reading the memory elements of the various embodiments of the present invention. FIG. 9 is shown to include a memory cell 1002 coupled to a sense amplifier circuit 1004, which is shown coupled to a reference circuit 1006. The memory cell 1002 is shown to include an access transistor 1008, an MTJ 1010 and an MTJ 1012. The transistor 1008 is shown to have a drain, a source and a gate. The gate of the transistor 1008 is shown coupled to a word line 1014, the drain of the transistor is shown coupled to ground and the source of the transistor is shown coupled to the MTJ 1010.

It should be noted that wherever values are indicated herein, they are to merely serve as examples with the understanding that other suitable values are anticipated. It is further noted that while reference is made to an N-type or P-type transistor, either type or other suitable types of transistors may be employed, as the type of transistor indicated in the foregoing embodiments, merely serve as examples.

The circuit 1006 is shown to include a number of state reference circuits, indicated as state reference circuit 1020, 1022 and 1024. Each of the circuits 1020-1024 includes an access transistor and a reference resistor. For example, the circuit 1020 is shown to include a reference resistor 1026 coupled on one side to the circuit 1004 and Vcc and on the other side to the drain of an access transistor 1028. The gate of the transistor 1028 is shown coupled to a select signal, namely select 1 signal 1040.

Similarly, the circuit 1022 is shown to include a reference resistor 1030 coupled on one side to the circuit 1004 and Vcc and on the other side to the drain of an access transistor 1032. The gate of the transistor 1032 is shown coupled to a select signal, namely the select 2 signal 1042. The circuit 1024 is shown to include a reference resistor 1034 coupled on one side to the circuit 1004 and Vcc and on the other side to the drain of an access transistor 1036. The gate of the transistor 1036 is shown coupled to a select signal, namely the select 3 signal 1044.

The MTJs 1010 and 1012, as stated relative to FIG. 8, are similar to the MTJs of the embodiments of the present invention except that in the case of FIG. 7, the MTJs of the read circuit would be coupled in parallel rather than in series shown in FIG. 9.

During a read operation, the memory cell 1002 is selected by raising the voltage of the word line 1014. The circuit 1004 compares the total resistance of the MTJs 1010 and 1012 with the resistances of the reference resistors of the state reference circuits. For example, the resistance of the MTJs 1010 and 1012 (collectively or added together) is compared to the resistance of the resistor 1026 and if it is determined to be less, the state of the memory cell 1002 is declared as binary value "00"

or perhaps state 1. However, if the resistance of the MTJs 1010 and 1012, collectively, is determined to be higher than that of the resistor 1026, the former is then compared to the resistance of the resistor 1030 and there again, if the resistance of the MTJs 1010 and 1012 is less than the resistor 1030, the state 2 or binary value "01" is declared. If the resistance of the MTJs 1010 and 1012 is determined to be greater than the resistor 1030, the resistance of the MTJs 1010 and 1012 is compared to the resistance of the resistor 1034 and if the resistance of the former is determined to be lower, the state 3 or binary value "10" is declared (or read), otherwise, the state 4 or binary value "11" is declared.

The select signal of each of the circuits 1020-1024 is used to select the corresponding circuit. For example, to compare the resistance of the MTJs to the resistance of the resistor 1026, the signal 1040 is activated, thereby turning on the transistor 1028. In the meanwhile, the remaining transistors of the circuit 1006 are off. Similarly, to compare the resistance of the MTJs to the resistance of the resistor 1030, the signal 1042 is activated, thereby turning on the transistor 1032. In the meanwhile, the remaining transistors of the circuit 1006 are off. To compare the resistance of the MTJs to the resistance of the resistor 1034, the signal 1044 is activated, thereby turning on the transistor 1036. In the meanwhile, the remaining transistors of the circuit 1006 are off.

Examples of resistance values of the reference resistors are averages of the resistances of the MTJs 1010 and 1012. For example, the resistance of the resistor 1026 is the average of the resistances of the MTJs 1010 and 1012 at the states 1 and 4, as indicated in Table 1. The resistance of the resistor 1030 is the average of the resistances of the MTJs 1010 and 1012 at the states 2 and 4, as indicated in Table 1. The resistance of the resistor 1034 is the average of the resistances of the MTJs 1010 and 1012 at the states 2 and 3, as indicated in Table 1. For example, in one embodiment of the present invention, the resistor 1026 has a resistance of 3.5 kilo-ohm, which is the average of 3 and 4 kilo-ohms. The resistance of the resistor 1030 is 4.5 kilo-ohms, which is the average of 5 and 4 kilo-ohms and the resistance of the resistor 1034 is 5.5 kilo-ohms, which is the average of 5 and 6 kilo-ohms.

In alternative embodiments of the present invention, the MTJs (or memory elements) disclosed in U.S. patent application Ser. No. 11/674,124 entitled "Non-Uniform Switching Based Non-Volatile Magnetic Base Memory", filed on Feb. 12, 2007, may be employed in the embodiments of FIGS. 8 and 9 herein.

It should be noted that the objects of the drawings or figures discussed and presented herein are not necessarily drawn to scale.

Figure 11B:
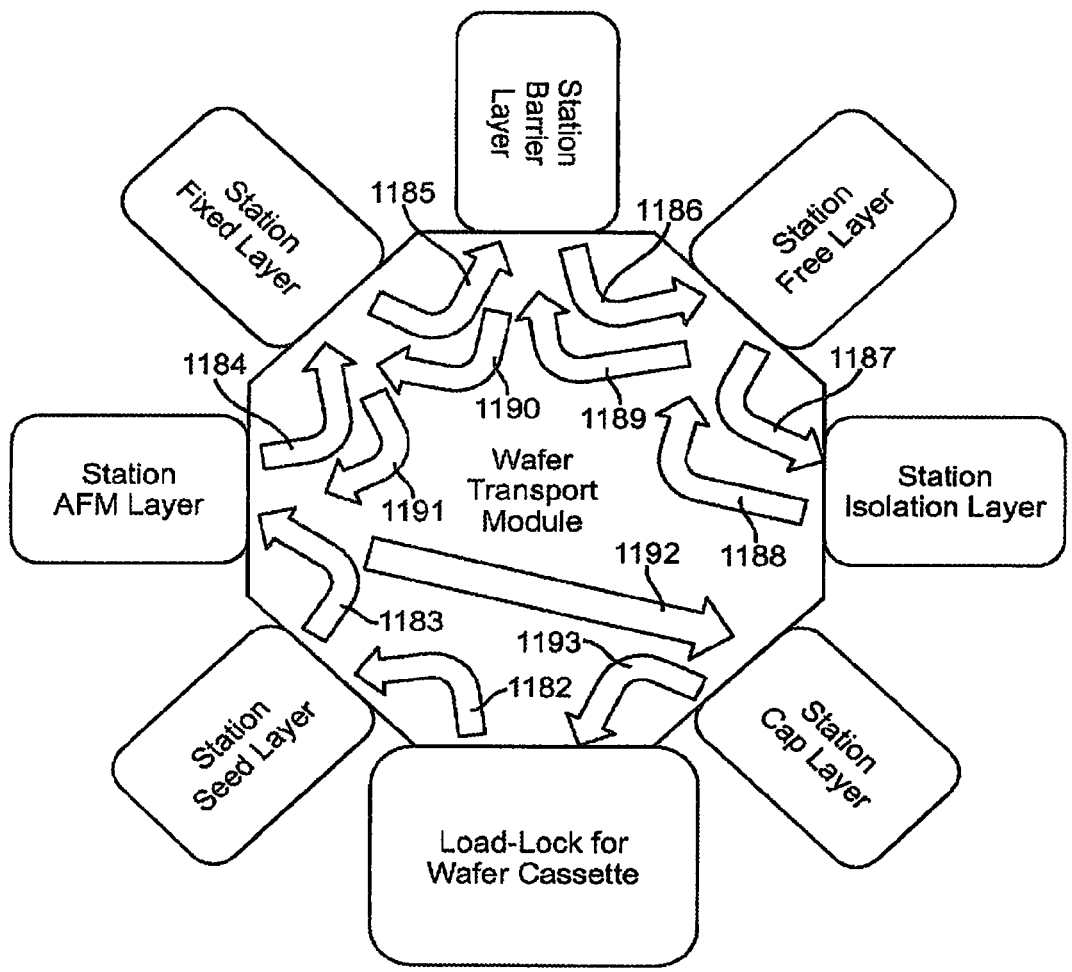

Referring now to FIG. 11(*a*), a flowchart illustrates the manufacturing steps of prior multi-state magnetic memory element wafers. The process begins with the movement of wafer #1 to station seed layer with step 1182, and a seed layer is then formed on wafer #1. From there, wafer #1 proceeds to station AFM layer with step 1183, and an anti-ferromagnetic (AFM) layer is formed on wafer #1. At step 1184, wafer #1 is transported to station fixed layer so that a fixed layer can be formed thereon. Subsequent to the formation of a fixed layer, step 1185 transports wafer #1 to station barrier layer for the formation of a barrier layer; step 1186 transports wafer #1 to station free layer for the formation of a free layer; and step 1187 transports wafer #1 to station isolation layer for the formation of an isolation layer. At this point, wafer #1 then flows backwards through the prior steps, beginning by going from station isolation layer to station free layer in step 1188, and so on. After the deposition of a fixed layer on wafer #1 at station fixed layer, wafer #1 travels to station anti-ferromagnetic layer at step 1191 and an anti-ferromagnetic layer is formed; and then on to receive a cap layer in step 1192. As better shown in FIG. 11(*b*), wafer #1 must pass backwards through the manufacturing hardware (notice step 1188 after step 1187), the manufacturing of wafer #2 is delayed until wafer #1 has cleared step 1192 in the wafer transport module. Ultimately, this results in a single wafer tying up an entire wafer transport module until the manufacturing of the wafer is completed.

Conversely, in an embodiment of the present invention, it is possible for multiple wafers to be undergoing manufacturing steps within the wafer transport module at all times, and the rate of manufacturing is thereby dramatically increased.

Figure 12B:
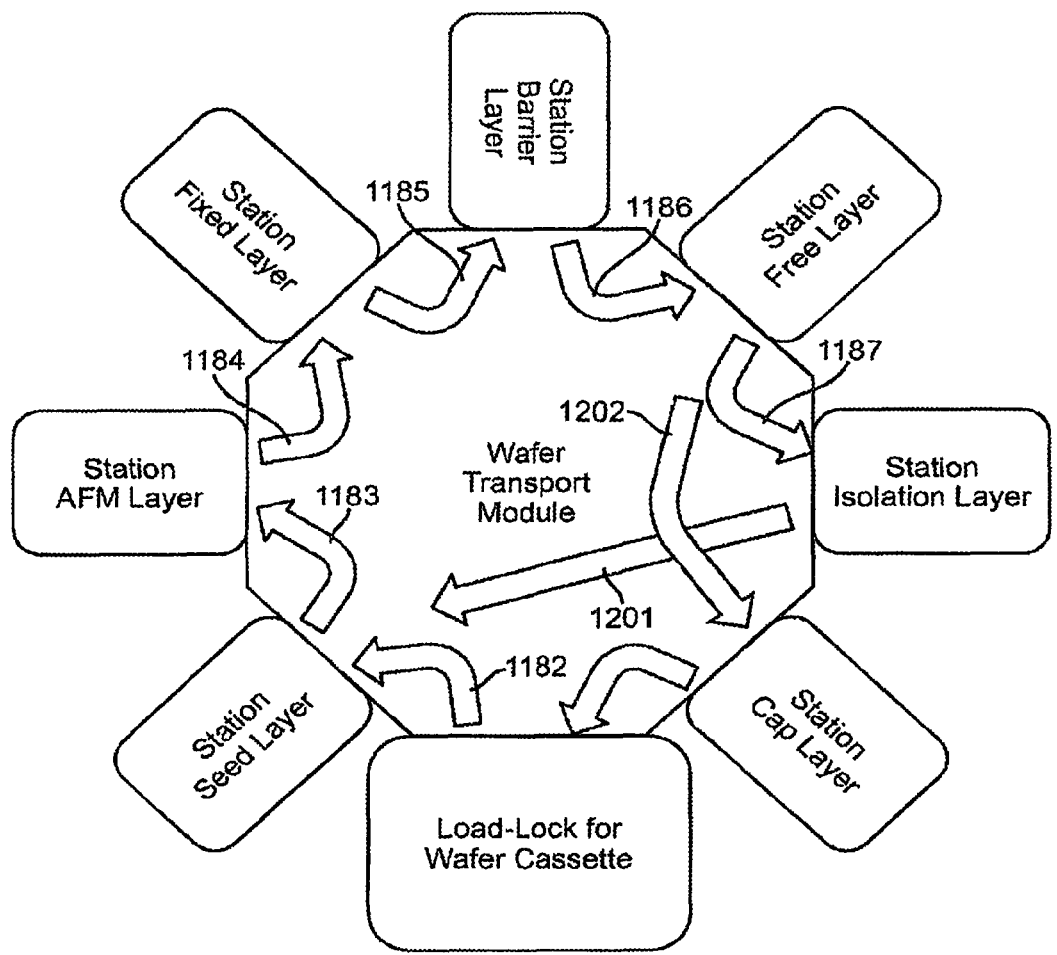

Referring now to FIG. 12(*a*), a flow chart shows the manufacturing process of an embodiment of the present invention. After a seed layer is formed on wafer #1, and wafer #1 is moved to station AFM layer at step 1183, wafer #2 can immediately be placed into station seed layer at step 1205 for the formation of a seed layer thereon. Subsequently, wafer #2 moves to station AFM layer at step 1210 at the same time wafer #1 is moved from station AFM layer to station fixed layer at step 1184 and wafer #3 is moved to station seed layer at step 1206. This process continues on in such a manner so that at step 1186, when wafer #1 is at station free layer, there are five wafers in the wafer transport module being manufactured in parallel, wafer #5 being at station seed layer. At this point, shown as step 1200 in FIG. 12(*a*), the wafer transport module determines whether a second MTJ has yet been deposited on the wafer within. If not, the wafer, wafer #1, now moves to station seed layer at step 1201, and proceeds for a second time through the stations of the wafer transport module. Upon wafer #1's return to step 1200, a second MTJ is present, and wafer #1 proceeds to station cap layer at step 1202, and a cap layer is formed thereon.

Subsequent to wafer #1 having formed a second seeding layer, wafer #2 will as well, and so on to wafer #5. Because each station will contain wafers #1-5 during this time, no new wafers will be entering the wafer transport module until wafer #5 is at station AFM layer for formation of the second AFM layer and wafer #1 has been removed from the wafer transport module.

In other embodiments of the present invention, "n" number of MTJs (more than two) may be desired on each wafer, and consequently the cycle will therefore proceed n times through each of the stations prior to step 1200.

This manner of manufacturing results in faster process qualification and optimization, and because of the frequency at which wafer transport modules are shut down for maintenance and repairs, consequently results in increased manufacturing uptime. This in turn results in higher throughput during manufacturing (i.e. larger number of wafers/hr) and hence lower cost per wafer and lower cost for the finished memory products. In addition, more than one process step can be combined into one process chamber, e.g. if the process chamber has more than one sputtering cathode.

Referring now to FIG. 10, the relevant layers of multi-state current-switching magnetic memory element 1100 are shown in accordance with an embodiment of the present invention. Memory element 1100 is shown to include bottom electrode 1101, on top of which is formed seeding layer 1103, on top of which is formed pinning layer 1105, on top of which is formed fixed layer 1107, on top of which is formed barrier layer 1109, on top of which is formed free layer 1111, on top of which is formed isolation layer 1113, on top of which is formed seeding layer 1115, on top of which is formed pinning layer 1117, on top of which is formed fixed layer 1119, on top of which is formed barrier layer 1121, on top of which is formed free layer 1123, on top of which is formed a cap layer 1124, on top of which is formed top electrode 1125.

Together, free layer 1111, barrier layer 1109, and fixed layer 1107 form MTJ 1, or MTJ 1140, of stack 1100. Similarly, free layer 1123, barrier layer 1121, and fixed layer 1119 form MTJ 2, or MTJ 1150, of stack 1100.

Top electrode 1125 and bottom electrode 1101 are made of tantalum (Ta) in one embodiment of the present invention; however, other conductive materials, which are capable of passing current to MTJs 1140 and 1150, may be used. Materials such as TiW, Ti, CrTa, NiTi, NiZr, AlCu may function as ideal electrode materials in alternative embodiments of the present invention. Bottom electrode 1101 is built on a metal line, aluminum or copper, for example, which is connected to a select transistor. In an alternative embodiment of the present invention, bottom electrode 1101 may also serve the purpose of seeding layer 1103, completely negating the need to have seeding layer 1103, and guide the formation of pinning layer 1105. In such an embodiment, pinning layer 1105 would be formed directly on top of bottom electrode 1101.

Seeding layers 1103 and 1115 assist pinning layers 1105 and 1117, respectively, in obtaining the desired crystalline structure at the atomic level. Seeding layers 1103 and 1115 are made of a material, for example, tantalum, which has molecular structure that induces the subsequently applied pinning layer to conform to a specific atomic pattern. This pattern, or crystalline structure, is required for pinning layers 1105 and 1117 to function as intended. Additionally, other face-centered-cubic (fcc) non-magnetic alloys, such as that of NiFe—Cr, NiFe—Si, NiFeZr or NiFeTa, can be inserted underneath the antiferromagnetic layer of the pinning layer 1105 as well as 1117. This again results in a better conformal growth at the atomic-level and thereby resulting in a higher pinning field.

Pinning layers 1105 and 1117 are also known as synthetic anti-ferromagnetic layers with the adjacent ferromagnetic layers 1107 and 1119, and function to keep the magnetic orientation of fixed layer 1107 and fixed layer 1119, respectively, static. In an embodiment of the current invention, pinning layers 1105 and 1117 are each further formed of three components or sub-layers—ruthenium (Ru) layer 1130, cobalt iron (CoFe) layer 1132, and iridium manganese (IrMn) layer 1134. IrMn layer 1134 is formed on top of either seeding layer 1115, which will be discussed in more detail shortly, or bottom electrode 1101. CoFe layer 1132 is formed on top of IrMn layer 1134, and Ru layer 1130 is formed on top of the CoFe layer 1132. Similarly, the pinning layer 1105 is made of multiple sub-layers in one embodiment of the present invention. In this case, the IrMn is formed on top of the seeding layer 1103, the CoFe layer is formed on top of the IrMn layer, and the Ru layer is formed on top of the IrMn layer.

The typical thickness of CoFe layer 1132 is 2-10 nm thick, the Ru layer 1130 is 0.6-1.0 nm thick, and IrMn layer 1134 is 5-25 nm thick. These thickness values provide the right combination to ensure pinning of the fixed layer as well as ensuring lower demagnetization field for making a high reliability as well as high performance storage memory.

The magnetic polarity of pinning layers 1105 and 1117 are permanently fixed by an annealing process that follows the complete deposition of all layers of stack 1100. The process involves heating of the entire wafer under conditions of a large single direction magnetic field, for an extended period of time. In one embodiment the annealing temperature is 375°C. and the external uniaxial field is 6 kOe for over 2 hours.

The switching currents of free layers 1123 and 1111 are dependent upon the composition, structure, size and geometry of each respective layer. The switching currents of free layers 1123 and 1111 of MTJs 1140 and 1150, respectively, are defined as the amount of current that, when applied to memory element 1100, causes the reversal of a free layer's magnetic moment. Each free layer in an embodiment of the present invention has a unique switching current. In an embodiment of the present invention, the unique switching currents are a consequence of the compositions of free layers 1123 and 1111; and the compositions of free layers 1123 and 1111 are manipulated by changing the amount of reactive gas used to form each free layer. In yet another embodiment, a target (sputtering process) containing oxide, such as $SiO_2$ and $TiO_2$, and the magnetic alloy is deposited on top of the free-layers 1123 and 1111, while the other layer is deposited using a target containing substantially no (or small amount of) of oxides. Thus, for example, if free layer 1123 is composed of 30-60% oxide, and free layer 1111 is composed of less than 10% oxide, and layers 1123 and 1111 are in a stacked configuration sharing the same size footprint (100×200 nanometers (nm) in this case), free layer 1123's switching current will be approximately 600 micro-amps (µA), while the switching current of the free layer 1111 will only be approximately ⅓ of that, 200 µA.

The unique switching currents of the free layers are a consequence of the oxides imparting a unique microstructure to each of the free layers, the microstructure being a direct function of the amount of oxides present when the free layer was formed. After deposition of both free layers 1123 and 1111, an annealing process is performed in one embodiment of the present invention. The annealing process, for example, involves heating of memory element 1100 to a temperature of 350° C. for over 2 hours. The annealing process results in the formation of non-conductive and non-magnetic micro-channels within the free layers, which are explained in detail in respect to free layer 104 of FIGS. 6(b) and (c) of U.S. patent application Ser. No. 11/674,124, entitled "Non-Uniform Switching Based Non-Volatile Magnetic Based Memory," by Ranjan, et al., filed Feb. 12, 2007, the contents of which is incorporated herein as if set out in full. In other embodiments of the present invention, the micro-channels of free layers 1123 and 1111 can be formed by depositing one of the free-layers in the presence of reactive gases as described in patent application Ser. No. 11/674,124, entitled "Non-Uniform Switching Based Non-Volatile Magnetic Based Memory," by Ranjan, et al., filed Feb. 12, 2007. In yet another embodiment, one of the free-layers 1123 and 1111 is made of CoFeB—X, where X is chosen from one or more of: chromium (Cr), tantalum (Ta), molybdenum (Mo), nickel (Ni), copper (Cu), and the thickness is less than 80% of the other free-layer, and thereby resulting in switching current ratios of over 2 between the two individual magnetic tunnel junctions (MTJs). In yet another embodiment, one of the free-layers 1123 and 1111, typically the topmost free layer has the effective average saturation magnetization of less than 75% of the bottom free layer. In any case, the free layers are designed in such a way that their switching currents are different by at least a factor of two.

Table 3 further shows how stack 1100 has four possible states, depending upon the amount and direction of current that is applied to stack 1100. In the case of State I, or "00", the magnetic moments of the free layers 1111 and 1123 are in a direction parallel to those of their respective fixed layers 1107 and 1119 upon the application of approximately 600 µA of current to stack 1100. The application of approximately −600 µA of current results in the magnetic moment of both free layers 1111 and 1123 being switched to a state anti-parallel with their respective fixed layers 1107 and 1119, resulting state "11".

In one embodiment of the present invention, current 1181 is generally applied to the stack 1100 at the bottom electrode 1101 and through the intermediate layers to the top electrode 1125.

In another embodiment of the present invention, current 1180 is applied to the top electrode 1125, through the intermediate layers, to the bottom electrode 1101. The application of current with a positive value (i.e., 600 µA) is current that is applied in the direction of current 1180: starting at top electrode 1125, passing through the intermediate layers of memory element 1100, and exiting at bottom electrode 1101. The application of current with a negative value (i.e., −600 µA) is current that is applied in the direction of current 1181: starting at bottom electrode 1101, passing through the intermediate layers of memory element 1100, and exiting at top electrode 1125.

Alternatively, when only approximately 200 µA or −200 µA of current is applied to stack 1100, the magnetic moment of a free layer of one MTJ is caused to be parallel with the magnetic moment of the fixed layer, and the other is caused to be anti-parallel. To further clarify, for example, approximately 200 µA results in parallel magnetic moments in MTJ 1150 and anti-parallel magnetic moments in MTJ 1140; whereas −200 µA results in anti-parallel magnetic moments in MTJ 1150 and parallel magnetic moments in MTJ 1140—the states "01" and "10", respectively.

The switching current applied to stack 1100 controls the states of the magnetic moments of the free layers of MTJs 1140 and 1150, and thus the binary value represented within stack 1100. The application of this switching current therefore results in program and erase operations, and these operations are controlled by a program and erase circuit. For further details regarding the function of the program and erase circuit, see circuit 900 and related discussion in FIG. 8 of U.S. patent application Ser. No. 11/678,515, entitled "A High Capacity Low Cost Multi-State Magnetic Memory," filed Feb. 23, 2007, by Ranjan et al., the contents of which are incorporated herein as though set forth in full.

Barrier layers 1109 and 1121 act as filters for electrons with different spins, which gives rise to different amounts of tunneling currents, thereby causing there to be two unique resistance values for each MTJ, depending on the orientation of the magnetic moment of the free layer in relation to that of its respective fixed layer. In an embodiment of the present invention, barrier layers 1109 and 1121 are composed of substantially crystalline, magnesium oxide (MgO) having a (100) crystalline structure with (100) indicating crystal planes substantially parallel to the film plane. The MgO barrier layers 1109 and 1121 are initially formed as crystalline layers of MgO, whereas the adjacent layers 1111 and 1107 to 1109 layer, and layers 1123 and 1119 to the barrier layer 1121, are substantially amorphous CoFeB alloy. The annealing process previously discussed herein brings about a change in the transformation in the amorphous layers into crystalline layers of substantially cubic CoFeB alloy, such as one having a (100) structure. This results in the formation of coherent channels for tunneling of magnetic spins leading to high TMR (tunneling magneto-resistance) ratio.

In one embodiment of the present invention, the barrier layer of each MTJ has a different thickness, i.e., the thickness of barrier layer 1109 is different from that of barrier layer 1121. This difference in thickness causes MTJs 1140 and 1150 to have not only two unique resistance values per MTJ, but entirely unique resistance values from each other, thus causing stack 1100 to have four different resistance values—two for each MTJ. A stack, for example, with three MTJs would have a third barrier layer of a third thickness, different from the other two, causing the associated stack to then have six different resistance values—the resistance value at any time being dependent upon the states of the MTJs within.

Referring now to Table 4, resistance values of MTJs, depending upon the MTJ state and barrier layer thickness, are estimated. For example, in Scenario 1 the ratio of the thickness of the barrier layer of one of the MTJs of a stack, to the thickness of the barrier layer of another MTJ of the same stack is 1:1.2, or a thickness of approximately 1 nm for layer 1109 and a thickness of approximately 1.2 nm for barrier layer 1121. As a consequence of the different barrier layer thicknesses, the resistance of MTJ1 (MTJ 1140) is approximately 400 ohms (Ω) when it is in state 0, and about 800Ω when it is in state 1. Accordingly, the resistance for MTJ2 (MTJ 1150) will be about 600Ω when it is in state 0, and about 1320Ω when it is in state 1. Scenarios 2 and 3 of Table 4 estimate other relative resistance values, depending upon the thicknesses of the barrier layers.

The resistance of MTJs 1140 and 1150 is used to determine the state of stack 1100 (i.e. 00, 01, 10 or 11) whenever a read operation takes place. The total resistance of stack 1100, a combination of the resistances of MJT 1140 and MJT 1150, is read by a read circuit, which then compares the resistance of stack 1100 to a series of reference circuits. The resistance of each MTJ in stack 1100 is dependent upon the MTJ state; that is, whether the free layer and fixed layer are parallel or anti-parallel at that time. A detailed description of the reading process of stack 1100 is discussed in further detail in regards to read circuit 1000 in U.S. patent application Ser. No. 11/678,515, entitled "A High Capacity Low Cost Multi-State Magnetic Memory," filed on Feb. 23, 2007, by Ranjan et alii.

Table 5 shows how the total resistance of stack 1100 changes depending upon the states of MTJs 1140 and 1150 within. In scenario 1 of Tables 4 and 5, a 1:1.2 barrier layer thickness ratio, as described prior, is used, and the total resistance of stack 1100 is estimated to be 1000Ω with both MTJ 1140 and MTJ 1150 having free layers with magnetic moments in a parallel direction relative to their respective fixed layers (state 00). The total resistance of stack 1100 is increased by about 400Ω, to 1400Ω, when switched to state 01. Total resistance of stack 1100 can be further increased by switching stack 1100 to states 10 and 11, for resistances of about 1720Ω and 2120Ω, respectively.

Each sequential increase in resistance of stack 1100 under scenario 1 is approximately 300-400Ω greater than that of the prior state. This roughly equal stepwise increase of each subsequent resistance value is an ideal configuration, as it lends itself to a more simpler and reliable reading circuit design.

Referring now to scenarios 2 and 3 of Table 5, it becomes apparent that as the ratio of the barrier thickness increases, so will the total resistance of stack 1100 while in any of its four possible states. In scenario 3, where barrier layer 1121 of MTJ 1150 is twice as thick as barrier layer 1109 of MTJ 1140, i.e. 2 nm and 1 nm thick, the total resistance of the circuit with both MTJs' magnetic moments being in parallel (state 00) is 2400Ω—significantly more than the maximum resistance of stack 1100 with a barrier layer ratio of 1:1.2 even when the free layers of MTJs 1140 and 1150 have magnetic moments in anti-parallel state relative to their respective fixed layers. The remaining total resistance values of stack 1100 under the scenario of a 2:1 barrier layer thickness ratio are 2800Ω in state 01, then 6400Ω in state 10, and 6800Ω in state 11. The relatively consistent stepwise increase in resistance, as experienced in scenario 1, is lost in scenario 3, the total resistance for which increases in an irregular but monotonic manner—from 400-3600Ω between subsequent states. Such radical differences may make the circuit more complicated.

In an embodiment of the present invention, barrier layers 1109 and 1121 are composed substantially of a non-magnetic material, for example, magnesium oxide (MgO). In alternative embodiments of the present invention, barrier layers 1109 and 1121 are composed of one or more of the following compounds: aluminum oxide ($Al_2O_3$), titanium oxide ($TiO_2$), magnesium oxide (MgOx), ruthenium oxide (RuO), strontium oxide (SrO), and zinc oxide (ZnO).

Isolation layer 1113 is typically 2-200 nm thick, with a preferred thickness range of 2-50 nm. Isolation layer 1113 is formed on top of free layer 1111 of MTJ 1140, and isolates MTJs 1140 and 1150 from each other. The isolation of MTJ 1140 from 1150 serves three purposes: (1) magnetic isolation by reducing magnetostatic interaction, (2) microstructure isolation by separating the seeding effect, and (3) separation of layer states.

If additional MTJs were to be formed on stack 1100, an additional isolation layer would be formed below the seeding layer of each of the additional MTJs, and on top of the free layer of the MTJ below each addition MTJ. It should be noted that the most preferred choice of material for isolation layer 1113 is an amorphous non-magnetic alloy: for example, nickel-niobium (NiNb), nickel-phosphorous (NiP), nickel-vanadium (NiV), nickel-boron (NiB), or copper-zirconium (CuZr). A crystalline non-magnetic alloy may also work.

While the embodiments described here so far have their magnetic moments in-plane, i.e., substantially parallel to the surface planes, this invention also applies to magnetic memory cells having substantially perpendicular magnetic orientation where the magnetic moments of the free and fixed layers 1107, 1111, 1119 and 1123 are substantially perpendicular to the film planes. Of course, the choice of the alloys for these layers as well as adjacent layers will be different in order to induce and support the perpendicular magnetic orientation in these layers.

Although the present invention has been described in terms of specific embodiment, it is anticipated that alterations and modifications thereof will no doubt become apparent to those more skilled in the art. It is therefore intended that the following claims be interpreted as covering all such alterations and modification as fall within the true spirit and scope of the invention.

What is claimed is:

1. A multi-state current-switching magnetic memory element configured to store a state by current flowing therethrough to switch the state comprising:
   a stack of two or more magnetic tunnel junctions (MTJs), each MTJ including a free layer with a switchable magnetic orientation perpendicular to a layer plane thereof, a barrier layer, and a fixed layer with a fixed magnetic orientation perpendicular to a layer plane thereof, each MTJ being separated from other MTJs in the stack by at least an isolation layer, the stack of MTJs operable to store more than one bit of information,
   wherein the free layer of each MTJ has a switching current threshold different from free layers of other MTJs in the stack.

2. The magnetic memory element of claim 1, wherein the free layer of each MTJ has a different composition from free layers of other MTJs in the stack.

3. The magnetic memory element of claim 1, wherein the free layer of each MTJ has a different oxide content from free layers of other MTJs in the stack.

4. The magnetic memory element of claim 1, wherein the isolation layer has an amorphous structure.

5. The magnetic memory element of claim 1, wherein the isolation layer is non-magnetic.

6. The magnetic memory element of claim 1, wherein each MTJ in the stack stores one bit of information.

7. The magnetic memory element of claim 1, wherein each MTJ has a different thickness from other MTJs in the stack.

8. The magnetic memory element of claim 1, wherein each MTJ has a different in-plane dimension compared with other MTJs in the stack.

9. The magnetic memory element of claim 1, wherein the barrier layer of each MTJ has a different thickness from barrier layers of other MTJs in the stack, thereby providing each MTJ a unique electrical resistance.

\* \* \* \* \*